(12) United States Patent
Danzl et al.

(10) Patent No.: US 9,171,721 B2
(45) Date of Patent: Oct. 27, 2015

(54) LASER ASSISTED DIRECT BONDING

(75) Inventors: Ralph B. Danzl, Tempe, AZ (US);
David A. Ruben, Mesa, AZ (US);
Michael S. Sandlin, Chandler, AZ (US)

(73) Assignee: Medtronic, Inc., Minneapolis, MN (US)

( * ) Notice: Subject to any disclaimer, the term of this patent is extended or adjusted under 35 U.S.C. 154(b) by 410 days.

(21) Appl. No.: 12/912,433

(22) Filed: Oct. 26, 2010

(65) Prior Publication Data
US 2012/0100318 A1    Apr. 26, 2012

(51) Int. Cl.
*B32B 1/00* (2006.01)
*H01L 21/18* (2006.01)

(52) U.S. Cl.
CPC ............. *H01L 21/187* (2013.01); *Y10T 428/13* (2015.01); *Y10T 428/24942* (2015.01); *Y10T 428/31504* (2015.04)

(58) Field of Classification Search
CPC ........................................................ B32B 17/00
USPC .................................. 156/272.2, 272.8, 153
See application file for complete search history.

(56) References Cited

U.S. PATENT DOCUMENTS

| | | | |
|---|---|---|---|
| 4,810,318 A | | 3/1989 | Haisma et al. |
| 5,054,683 A | | 10/1991 | Haisma et al. |
| 5,489,321 A | | 2/1996 | Tracy et al. |
| 5,647,932 A | * | 7/1997 | Taguchi et al. ............... 156/154 |
| 5,693,111 A | | 12/1997 | Kadowaki et al. |
| 6,477,901 B1 | | 11/2002 | Tadigadapa et al. |
| 6,555,025 B1 | | 4/2003 | Krupetsky et al. |
| 6,762,072 B2 | | 7/2004 | Lutz |
| 6,822,326 B2 | * | 11/2004 | Enquist et al. ................ 257/729 |
| 7,078,726 B2 | | 7/2006 | Pichler et al. |
| 7,417,307 B2 | | 8/2008 | Haluzak et al. |
| 7,540,934 B2 | | 6/2009 | Hofmann et al. |
| 8,125,146 B2 | | 2/2012 | Park |

(Continued)

FOREIGN PATENT DOCUMENTS

| | | | |
|---|---|---|---|
| DE | 102007008540 A1 | * | 8/2008 |
| EP | 0232935 A1 | | 8/1987 |

(Continued)

OTHER PUBLICATIONS

Sari et al., "Applications of laser transmission processes for the joining of plastics, silicon and glass micro parts," Microsyst Technol (2008) 14: 1879-1886, published online Jul. 18, 2008.*

(Continued)

*Primary Examiner* — Daniel McNally
(74) *Attorney, Agent, or Firm* — Evans M. Mburu

(57) ABSTRACT

Techniques are described for directly bonding different substrates together. In some examples, a technique includes placing a first surface of a first substrate in contact with a second surface of a second substrate to directly bond the first substrate to the second substrate at a contact location. The contact location is defined where at least a portion of the first surface of the first substrate contacts at least a portion of the second surface of the second substrate. The technique may also include directing a laser beam on at least a portion of the contact location to strengthen the direct bond between the first substrate and the second substrate. In this manner, a direct bond may be heated with localized laser energy to strengthen the direct bond. Localized laser energy may create a strong direct bond while minimizing thermal defects in regions proximate the direct bond.

21 Claims, 12 Drawing Sheets

(56) References Cited

U.S. PATENT DOCUMENTS

| | | |
|---|---|---|
| 8,448,468 B2 | 5/2013 | Pastel et al. |
| 2002/0115920 A1 | 8/2002 | Rich et al. |
| 2004/0012083 A1 | 1/2004 | Farrell et al. |
| 2004/0082145 A1 | 4/2004 | Reichenbach et al. |
| 2005/0151151 A1 | 7/2005 | Hawtof et al. |
| 2005/0284815 A1 | 12/2005 | Sparks et al. |
| 2006/0267167 A1 | 11/2006 | McCain |
| 2007/0170839 A1 | 7/2007 | Choi et al. |
| 2008/0102096 A1 | 5/2008 | Molin et al. |
| 2010/0262208 A1 | 10/2010 | Parker |
| 2010/0263794 A1 | 10/2010 | George et al. |
| 2010/0304151 A1* | 12/2010 | Tuennermann et al. ...... 428/428 |

FOREIGN PATENT DOCUMENTS

| | | |
|---|---|---|
| EP | 1864784 A1 | 12/2007 |
| WO | 2008/044349 A1 | 4/2008 |
| WO | 2010117382 A1 | 10/2010 |

OTHER PUBLICATIONS

Wild et al., "Locally selective bonding of silicon and glass with laser," Sensors and Actuators A, vol. 93, Issue 1, Aug. 25, 2001, pp. 63-69.*

Office Action from related U.S. Appl. No. 12/977,890 dated Dec. 31, 2012 (17 pages).

Wiemer et al., "Developments trends in the field of wafer bonding technologies," 214th ECS Meeting, Abstract #2229, Oct. 12-17, 2008, Honolulu, HI (1 p.).

Theppakuttai et al., Localized Laser Transmission Bonding for Microsystem Fabrication and Packaging, Journal of Manufacturing Processes, vol. 6, No. 1 2004 (8 pp).

Wild et al., "Locally selective bonding of silicon and glass with laser," Sensors and Actuators A: Physical, vol. 93, Issue 1, Aug. 25, 2001, pp. 63-69.

Park, "Characterization of transmission laser bonding (TLB) technique for microsystem packaging," Arizona State University, May 2006 (135 pp.).

U.S. Appl. No. 13/016,253, by Richard O'Brien, filed Jan. 28, 2011.

U.S. Appl. No. 12/977,890, by David A. Ruben, filed Dec. 23, 2010.

Gillner et al., "Laser Bonding of Micro Optical Components," Proceedings of SPIE, vol. 4941, pp. 112-120, Oct. 2003.

Witte et al., "Laser joining of glass with silicon," Proceedings of SPIE, vol. 4637, Jan. 21, 2002, pp. 487-495.

International Search Report and Written Opinion of international application No. PCT/US2011/033990, dated Aug. 29, 2011, 11 pp.

Office Action from U.S. Appl. No. 12/977,890 dated Jun. 5, 2013 (19 pages).

Amendment from U.S. Appl. No. 13/016,253, filed May 28, 2013 (11 pages).

Brown, "Precision Laser Welding of Clear Thermoplastics Without Additives", Medical Design Technology, Aug. 5, 2013, 7 pages. Located on the World Wide Web at http://www.mdtmag.com/articles/2013/08/precision-laser-welding-clear-thermoplastics-without-additives.

International Preliminary Report on Patentability from corresponding international application No. PCT/US2011/033990, dated May 10, 2013, 8 pp.

Office Action from co-pending U.S. Appl. No. 13/016,253 dated Feb. 28, 2013 (10 pages).

* cited by examiner

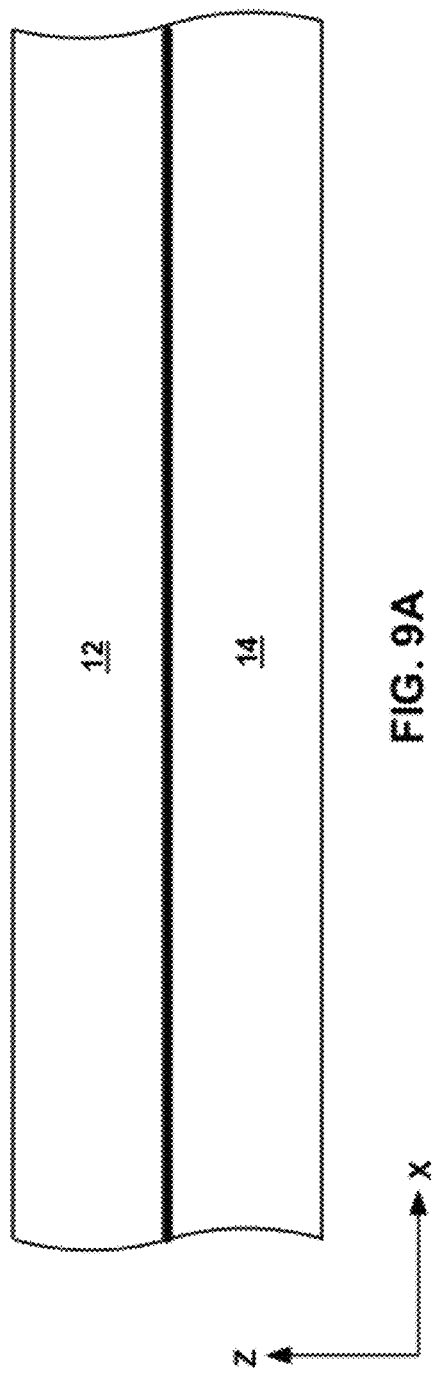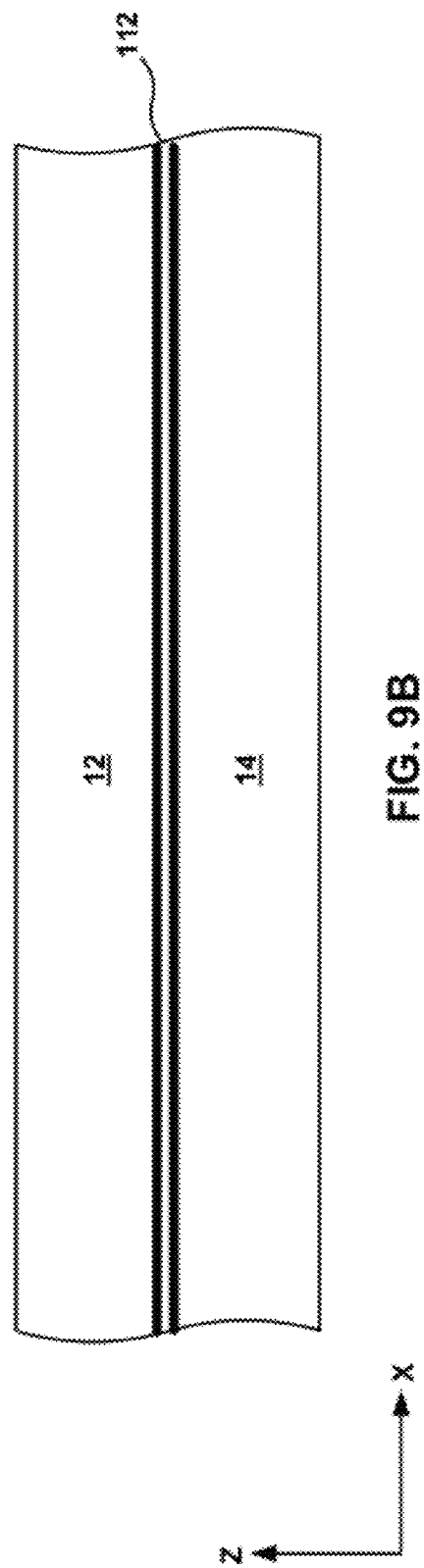

LASER ASSISTED DIRECT BONDING

TECHNICAL FIELD

This disclosure generally relates to material bonds and, more particularly, to material bonds created between two or more substrates.

BACKGROUND

The ability to bond different substrates together to form a bonded article is useful for a variety of different industries. As one example, the semiconductor industry uses material bonding techniques to bond different substrates together during semiconductor fabrication. As another example, the electronics industry uses bonding techniques to bond different substrates together during circuit fabrication. In addition, the medical device industry uses material bonding techniques to bond different materials together during medical device construction.

Direct wafer bonding is one type of bonding technique that is frequently used to bond semiconductor wafer materials together. Direct wafer bonding involves bonding wafer materials together without the aid of a specific bonding agent such as, for example, adhesive, wax, solder, or the like. Direct wafer bonding often involves preparing substrates so that atomic attraction forces can molecularly bond the substrates together when the substrates are brought into close contact. In some examples, the substrates are placed between two heated platens after bringing the substrates in close contact to cause covalent bonds to form between the different substrates.

Direct bonding techniques may be used to form component packages. A component package may house a component such as, e.g., an electrical component. A component package may be useful to protect the component from different environmental conditions such as, e.g., pressure changes, moisture, bodily fluids, or the like. However, because the process of forming a direct bond may involve heating the bond to an elevated temperature, temperature-sensitive components may experience thermal damage when placed in a package that is subsequently sealed using direct bonding techniques. Moreover, because the process of forming a direct bond may involve one or more cycles of heating and cooling, mismatches between coefficients of thermal expansion for different substrates being bonded may cause warping and thermal stress fractures to develop between the different substrates. Warping and thermal stress fractures may weaken the bond between the different substrates and may reduce the hermeticity of a component package formed using direct bonding techniques.

SUMMARY

In general, the disclosure is directed toward laser assisted direct bonding techniques. In some examples, laser assisted direct bonding involves directly bonding a first substrate to a second substrate at a contact location. The direct bond formed between the first substrate and the second substrate may be a comparatively weak direct bond that is not heated above ambient temperatures to thermally strengthen the bond. Alternatively, the direct bond may be heated above ambient temperatures to thermally strengthen the bond. In either case, a laser may be directed on at least a portion of the contact location where the direct bond was initially formed. In some examples, one of the substrates may be substantially transparent to a wavelength of the laser while another of the substrates may be substantially opaque to the wavelength of the laser. In these examples, laser energy may pass through the substrate substantially transparent to the wavelength of the laser and may be absorbed by the substrate substantially opaque to the wavelength of the laser. This may result in localized heating proximate to where the direct bond was initially formed. Localized heating may strengthen the direct bond initially formed between the substrates while reducing or eliminating the need for any subsequent bulk heating of the substrates.

In one example, this disclosure describes a method that includes placing a first surface of a first substrate in contact with a second surface of a second substrate to directly bond the first substrate to the second substrate at a contact location, the contact location defined where at least a portion of the first surface of the first substrate contacts at least a portion of the second surface of the second substrate. The method also includes directing a laser beam on at least a portion of the contact location to strengthen the direct bond between the first substrate and the second substrate.

In another example, this disclosure describes a method that includes polishing a first surface of a first substrate and a second surface of a second substrate, cleaning the first surface and the second surface such that the first surface and the second surface are substantially free of particles greater than 0.1 micrometers, and placing the first surface in contact with the second surface to directly bond the first substrate to the second substrate at a contact location, the contact location defined where at least a portion of the first surface of the first substrate contacts at least a portion of the second surface of the second substrate. The method also includes directing a laser beam across at least a portion of a length of the contact location to strengthen the direct bond between the first substrate and the second substrate, where the laser delivers between approximately 1 Joule per square millimeter ($J/mm^2$) and approximately 8 Joules per square millimeter.

In another example, this disclosure describes an article that includes a first substrate defining a first surface, a second substrate defining a second surface, and a direct bond formed between the first surface of the first substrate and the second surface of the second substrate. When viewing the direct bond with a differential interference contrast microscope, a heat-affected region aligned with the direct bond is visible. When viewing the direct bond with a bright field optical microscope, the heat-affected region is not visible.

In another example, this disclosure describes an article that includes a first substrate defining a first surface and a first tensile strength, a second substrate defining a second surface and a second tensile strength, and a laser-enhanced direct bond formed between the first surface of the first substrate and the second surface of the second substrate.

The details of one or more examples are set forth in the accompanying drawings and the description below. Other features, objects, and advantages will be apparent from the description and drawings, and from the claims.

BRIEF DESCRIPTION OF DRAWINGS

FIGS. 9A and 9B are cross-sectional schematics of direct bonds between the two substrates illustrated in FIGS. 1A and 1B, as the bonds may appear after chemical etchant testing.

DETAILED DESCRIPTION

Figure 1A:
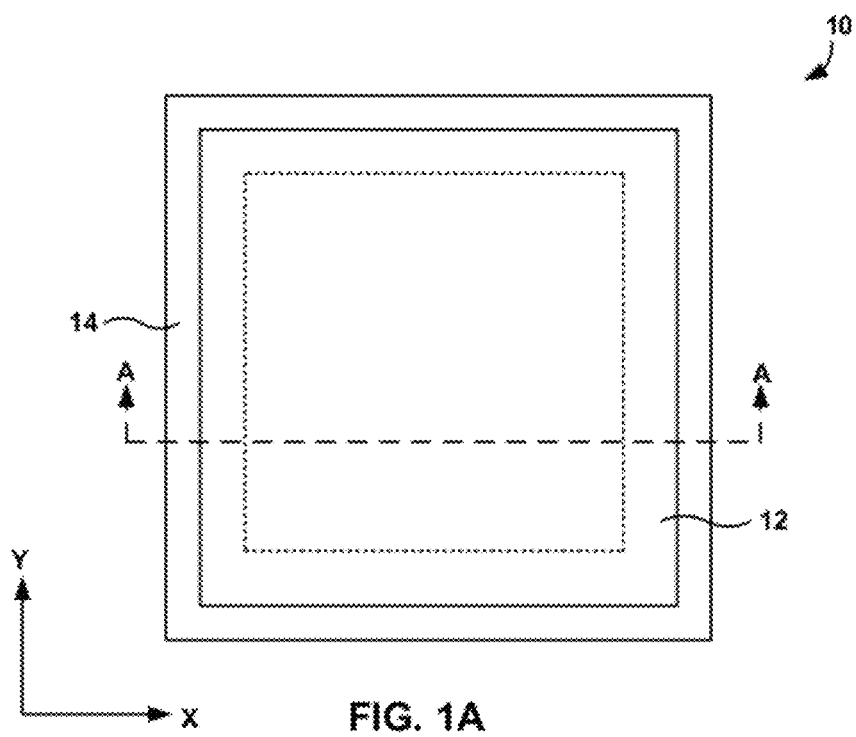
FIGS. 1A and 1B are schematic drawings of an example article that includes two substrates directly bonded together using the techniques of the disclosure.

Material bonding techniques are useful for bonding different materials together. In general, different material bonding processes use different techniques to create a bond between two or more separate substrates. A bond may be an attractive force that holds the two or more substrates in a fixed arrangement to create a unified composite component. In some examples, a material bonding technique may use a specific bonding agent such as, e.g., an adhesive, a cementing material, or a fusible ingredient, to create the bond between the two or more substrates. In other examples, a material bonding technique may create a direct bond between the two or more substrates without the assistance of a specific bonding agent. A direct bond may be useful because compatibility issues associated with a specific bonding agent (e.g., chemical and mechanical stress compatibility issues) may not exist when different substrates are directly bonded together.

A direct bond may be formed between different substrates using a variety of techniques. In one example, a direct bond may be formed by preparing contact surfaces of the different substrates so that the contact surfaces are ultra smooth and contamination free. The contact surfaces of the different substrates can then be brought into intimate contact (e.g., within a few nanometers) to induce molecular attraction between the molecules of the different substrates. In this manner, a weak molecular bond may be established between the different substrates.

In some examples, the weak molecular bond between the different substrates may be heated above a certain temperature to overcome an activation energy required to form covalent bonds between the atoms or molecules of the different substrates. Covalent bond formation may strengthen the connection between the different substrates. However, the process of forming the direct bond may require heating the different substrates and any materials or components proximate to the different substrates to elevated temperatures. In some examples, temperatures may exceed 200 degrees Celsius or may even exceed 400 degrees Celsius. In some examples, these temperatures may damage thermally sensitive materials and/or components. Moreover, because the process of forming a direct bond may involve one or more cycles of heating and cooling, mismatches between coefficients of thermal expansion for different substrates may cause warping and thermal stress fractures to develop between the different substrates. Warping and thermal stress fractures may weaken the bond between different substrates.

One technique that may be used to form a bond between different substrates without the use of a bonding agent is laser bonding. Laser bonding may involve placing different substrates into close contact, clamping the different substrates in a fixed arrangement, and then applying laser energy to a contact area between the different substrates. The laser energy may melt one or both substrates around the contact area to produce molecular mixing between the different substrates. As the contact area cools, the melted, intermixed material may solidify to provide a bond between the different substrates. However, because of the high laser energies generally necessary to melt-bond the different substrates, cracking, void pockets, or other defects may be observed around the heat-affected contact area. These defects may weaken the bond between the substrates. Moreover, because different substrates may not be perfectly aligned during the clamping process, measureable gaps may appear at various points in the contact area of the different substrates even after laser bonding. These gaps may also weaken the bond between the substrates.

This disclosure describes techniques for bonding two or more separate substrates to form a unified structure. In some examples, a bonding technique in accordance with the disclosure includes placing a first surface of a first substrate in contact with a second surface of a second substrate to directly bond the first substrate to the second substrate at a contact location and thereafter directing a laser on at least a portion of the contact location to strengthen the direct bond between the first substrate and the second substrate. During direct bonding, molecular attraction forces may initially create a comparatively weak direct bond between the first and second substrates. In some examples, the first substrate and second substrate may be heated (e.g., in an oven) to further strengthen the direct bond between the substrates. In any event, the direct bond may be strengthened with laser energy using the techniques of the disclosure.

In some examples according to the disclosure, the laser may supply laser energy to a localized region of the contact location between the first substrate and the second substrate. The localized laser energy may reduce or eliminate thermal damage to regions of the substrates adjacent the contact location as compared to other bonding techniques.

In some examples, an article produced according to the techniques of the disclosure includes a laser-enhanced bond that exhibits greater mechanical strength and/or chemical resistance than a bond formed using other bonding techniques. In one example, an article may include a first substrate defining a first surface and a first tensile strength, a second substrate defining a second surface and a second tensile strength, and a direct bond formed between the first surface of the first substrate and the second surface of the second substrate. The laser-enhanced direct bond may exhibit a tensile strength greater than at least 95 percent of the first tensile strength and greater than at least 95 percent of the second tensile strength. In some examples, the laser-enhanced direct bond may exhibit a tensile strength greater both the first tensile strength and the second tensile strength Different exemplary conceptual diagrams illustrating methods for directly bonding two or more substrates together with laser-assisted direct bonding techniques will be described in greater detail with respect to FIGS. 2-7. Further, example schematic diagrams of example bonds that may be formed according to the techniques of the disclosure will be described in greater detail with respect to FIGS. 8 and 9. However, an example article that includes a direct bond formed according to the techniques of the disclosure will first be described with reference to FIGS. 1A and 1B.

Figure 1B:
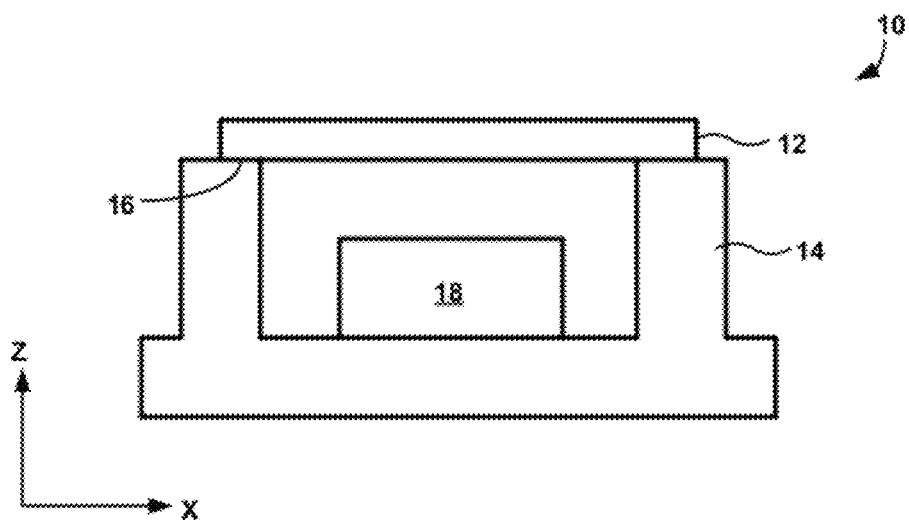

FIG. 1A is a schematic plan view illustration of an example article 10 that includes a substrate bond formed in accordance with the techniques of the disclosure. FIG. 1B is a schematic cross-sectional view of the same article 10 taken along the A-A cross-sectional line indicated in FIG. 1A. Article 10 may be any unified structure that is formed from two or more different substrates, although in FIGS. 1A and 1B, article 10 is depicted as a component package. Article 10 is formed from a first substrate 12 and a second substrate 14. First substrate 12 and second substrate 14 are bonded at a contact location 16. Contact location 16 is defined along a perimeter of first substrate 12 where first substrate 12 contacts second substrate 14. Article 10 is configured to house a component 18.

As described in greater detail below with reference to FIG. 2, article 10 is fabricated by directly bonding first substrate 12 to second substrate 14 at contact location 16 and thereafter directing laser energy on contact location 16. The laser energy may heat the region proximate contact location 16 to strengthen the direct bond between first substrate 12 and second substrate 14. In some examples, the laser energy may heat the region proximate contact location 16 to a temperature sufficient to overcome an activation energy barrier for covalent bond formation, causing covalent bonds to form between first substrate 12 and second substrate 14. In this manner, laser energy may strengthen a direct bond between first substrate 12 and second substrate 14.

In some examples, as further described in greater below with respect to FIG. 2, first substrate 12 and second substrate 14 are prepared for direct bonding before first substrate 12 is placed in contact with second substrate 14. For example, a portion of first substrate 12 and a portion of second substrate 14 may be polished to achieve a smooth surface before placing first substrate 12 in contact with second substrate 14. In another example, a portion of first substrate 12 and a portion of second substrate 14 may be chemically activated to facilitate direct bonding before placing first substrate 12 in contact with second substrate 14. First substrate 12 and second substrate 14 may also be cleaned, e.g., to remove particles or contamination that may inhibit direct bonding. After suitably preparing first substrate 12 and second substrate 14, first substrate 12 may be brought into intimate contact with second substrate 14 to establish a direct bond between the two substrates at contact location 16. Article 10 may be heated to strengthen the direct bond between first substrate 12 and second substrate 14 (e.g., by placing article 10 in an oven). In addition to, or in lieu of, heating article 10, a laser may be directed on at least a portion of contact location 16 to provide localized heating to strengthen the direct bond between the two substrates.

A direct bond formed between first substrate 12 and second substrate 14 may be useful for a variety of different applications. For example, as shown in FIGS. 1A and 1B, a direct bond formed between first substrate 12 and second substrate 14 may be used to fabricate a component package that houses component 18. The component package may protect component 18 during operation, e.g., from different environmental conditions in which component 18 operates. In some examples, first substrate 12 may be directly bonded to second substrate 14 along a portion of contact location 16 to prevent the two substrates from separating. In other examples, first substrate 12 may be directly bonded to second substrate 14 along substantially the entire length of contact location 16 to create a hermetically sealed component package. A hermetically sealed component package may preventingress or egress of fluids along contact location 16. For example, a hermetically sealed package may preventingress or egress of bodily fluids if article 10 is implanted within a body of a patient. A hermetically sealed package may also maintain a substantially constant pressure, e.g., an elevated pressure or vacuum pressure relative to atmospheric pressure.

Article 10 defines a cavity that houses component 18. Article 10 houses a single component 18 in FIG. 1B, although in other examples article 10 may house multiple components. Example components that may be housed by article 10 include, e.g., a battery, an electronic circuit, a microprocessor, a resonator, a sensor, a microelectromechanical system, a fluid delivery device, an electrical stimulation device, or the like. In some examples, article 10 may house a temperature sensitive component in addition to or in lieu of other types of components. A temperature sensitive component is a component that may degrade or otherwise deteriorate (e.g., malfunction) when exposed to a certain temperature. For example, component 18 may degrade or otherwise deteriorate when exposed to temperatures greater than 100 degrees Celsius such as, e.g., greater than 350 degrees Celsius. As described in greater detail below with respect to FIG. 2, bonding techniques in accordance with the disclosure may, in some examples, allow a temperature sensitive component to be placed in article 10 because the techniques may reduce or eliminate bulk heating necessary to bond first substrate 12 to second substrate 14 after placing component 18 in the package.

Article 10 can be fabricated into any suitable size and shape. Further, the size and shape of article 10 may vary, e.g., based on the intended used of article 10 and size and shape of component 18. In FIGS. 1A and 1B, article 10 defines a substantially square cross-sectional shape in both the X-Y and X-Z cross-sectional planes. In other examples, article 10 may define a different polygonal shape (e.g., rectangular, hexagonal, octagonal) or an arcuate shape (e.g., circular, elliptical) in one or more cross-sectional planes. Although the size of article 10 may vary, in some examples, article 10 may define a cavity between approximately 20 cubic millimeters and approximately 40 cubic millimeters. In still other examples, article 10 may include two or more directly bonded substrates that do not define a cavity for housing component 18.

Article 10 is defined by first substrate 12 and second substrate 14. Article 10 also defines a cavity that is closed when first substrate 12 is placed on top of second substrate 14 in a direction substantially orthogonal a contact location associated with second substrate 14 (i.e., in the Z-direction indicated on FIG. 1B). In different examples, article 10 may be fabricated from a different number of substrates and/or the substrates may contact one another in a different arrangement. In one example, article 10 may be fabricated from six substrates (e.g., one substrate for the top of article 10, one substrate for the bottom of article 10, and four substrates for the four sidewalls of article 10). In another example, article 10 may be fabricated from two hemispherical substrates that are bonded along an equator to define a sphere. In still another example, first substrate 12 and second substrate 14 may each include chamfered edges and contact location 16 may be defined where the chamfered edges of first substrate 12 and second substrate 14 contact. Other combinations and arrangements of substrates are possible. Therefore, although article 10 in FIGS. 1A and 1B includes first substrate 12 and second substrate 14 that contact at contact location 16 to define a ninety degree angle, in other examples, an article may include a different number of different arrangement of substrates.

First substrate 12 and second substrate 14 can be formed from any suitable materials and the selection of specific materials for first substrate 12 and second substrate 14 may vary, e.g., based on the operating environment of article 10. In some examples, as discussed in greater detail below with respect to FIG. 2, article 10 may be fabricated by directing a laser beam through first substrate 12 onto contact location 16 between first substrate 12 and second substrate 14. Second substrate 14 may absorb the laser energy, increasing the temperature of second substrate 14 in the region proximate contact location 16.

In these examples, first substrate 12 may be fabricated from a material that is substantially transparent to a wavelength of a laser beam while second substrate 14 may be fabricated from a material that is substantially opaque to the wavelength of the same laser beam. The term "substantially transparent" means that a wavelength of a laser beam transmits through first substrate 12 without being substantially absorbed. Conversely, the term "substantially opaque" means that the wavelength of the laser beam is substantially absorbed when the laser beam contacts second substrate 14. For example, in some instances, a material that is substantially transparent to a wavelength of a laser beam may be a material that exhibits a transmittance of greater than approximately 90% at the wavelength. A material that is substantially opaque to a wavelength of a laser beam may be a material that exhibits an absorbance of greater than approximately 35% at the wavelength.

In some examples, first substrate 12 may be substantially transparent to a wavelength of light between approximately 300 nanometers and approximately 1100 nanometers such as, e.g., between approximately 330 nanometers and approximately 750 nanometers. In some examples, second substrate 14 may be substantially opaque to these same ranges of wavelengths of light. Example materials for first substrate 12 and second substrate 14 include, but are not limited to, silicon, glass (e.g., sodium borosilicate glass), fused silica, quartz, diamond, sapphire, SiC, GaN, alumina, or the like. Other materials and wavelengths of light are contemplated, however, and it should be appreciated that a direct bond formed using the techniques of the disclosure are not limited to the specific materials listed above.

Figure 2:
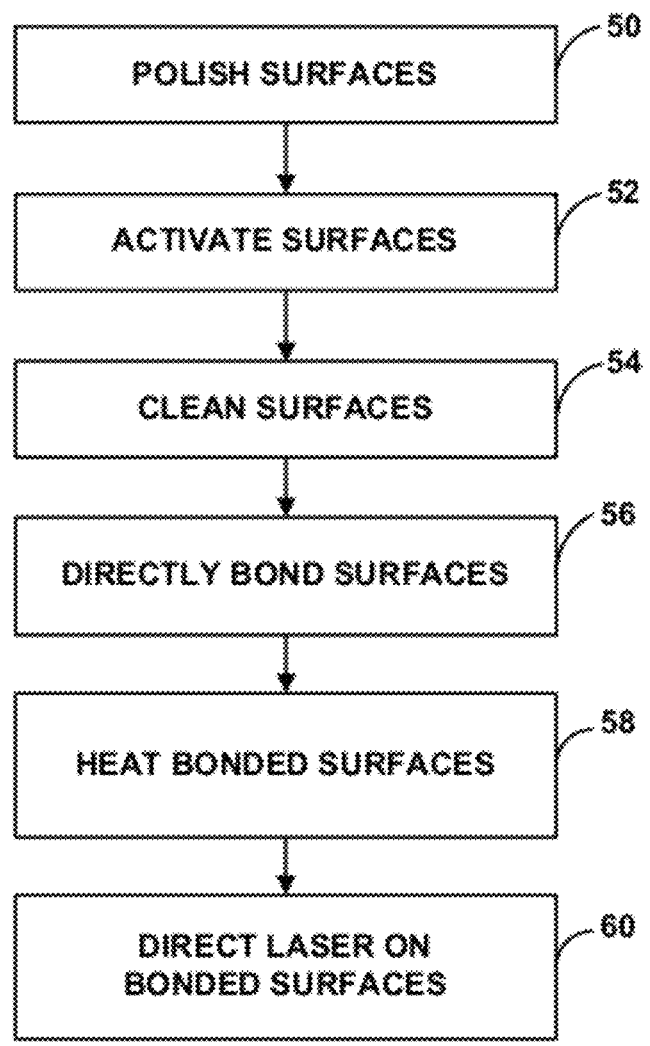
FIG. 2 is a flow diagram illustrating an example process that may be used to bond the two substrates illustrated in FIGS. 1A and 1B.
Figure 3:
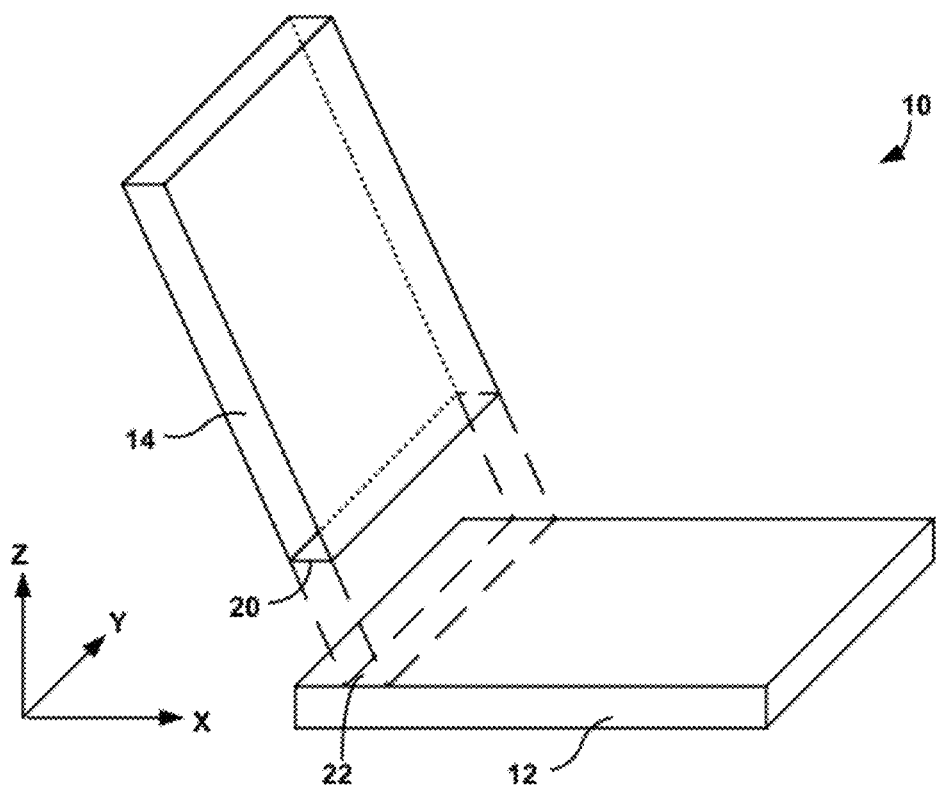
FIG. 3 is a schematic drawing of an example processing step that may be performed while implementing the example process of FIG. 2
Figure 4:
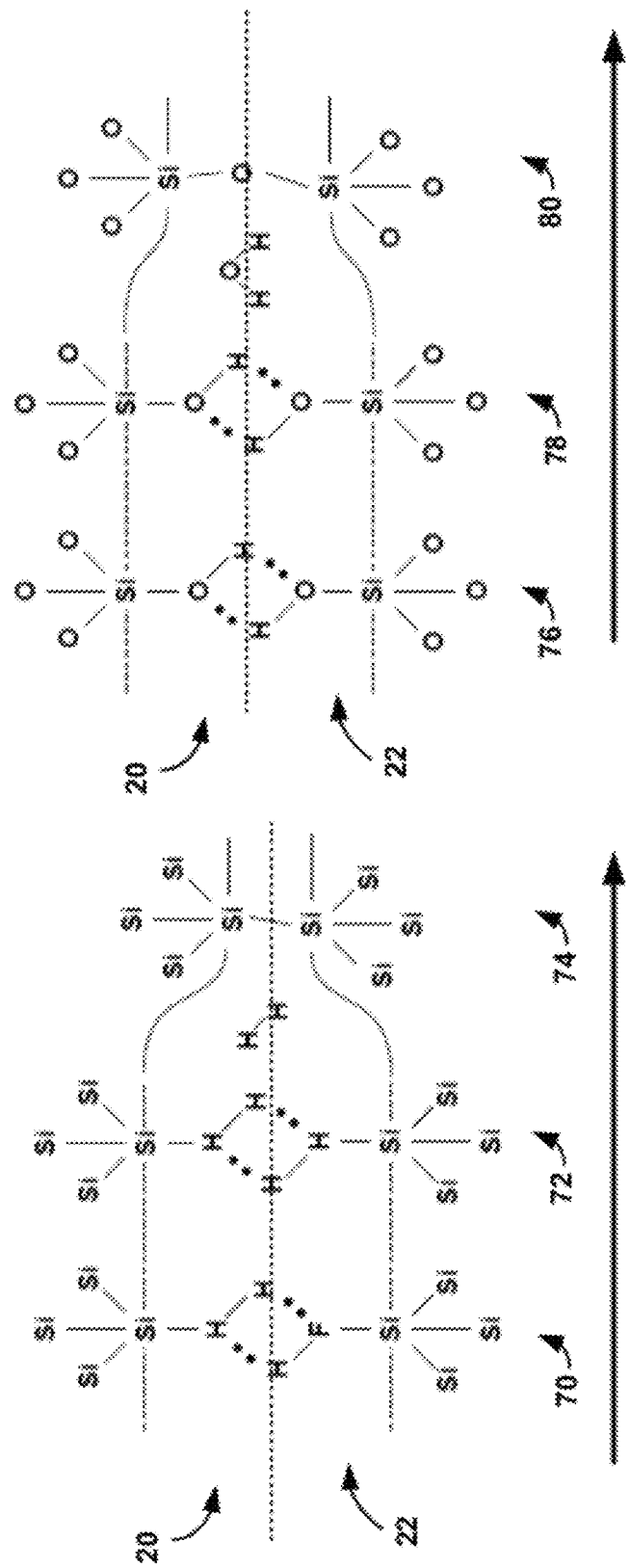
FIGS. 4A and 4B are schematic drawing of example reaction mechanisms that may occur while directly bonding two substrates together using the example process of FIG. 2.
Figure 5:
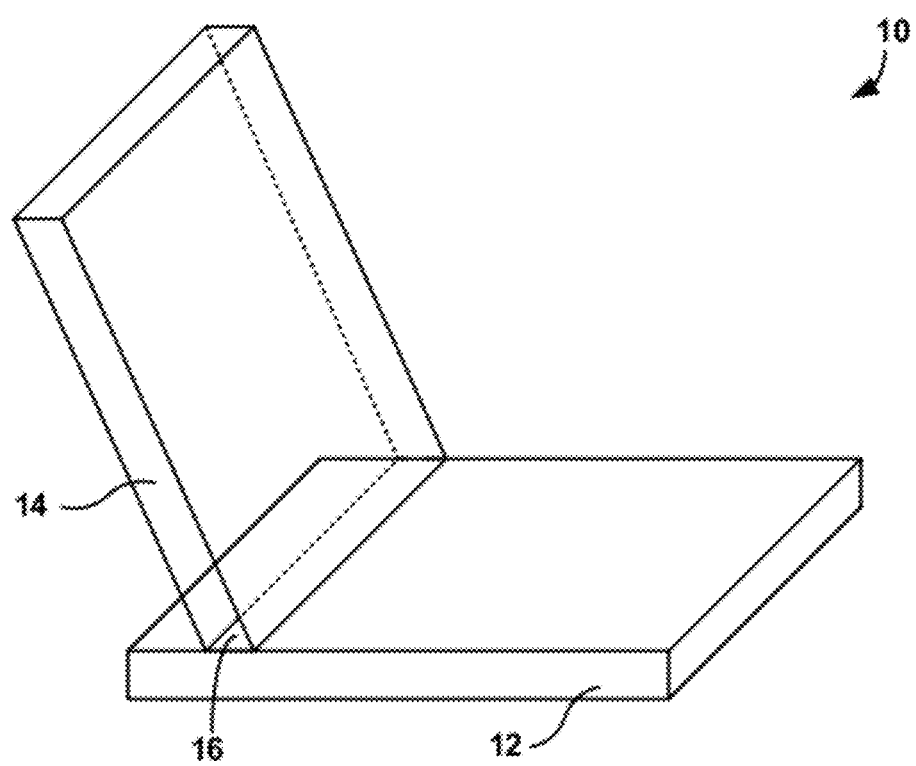
FIG. 5 is a schematic drawing of another example processing step that may be performed while implementing the example process of FIG. 2
Figure 6:
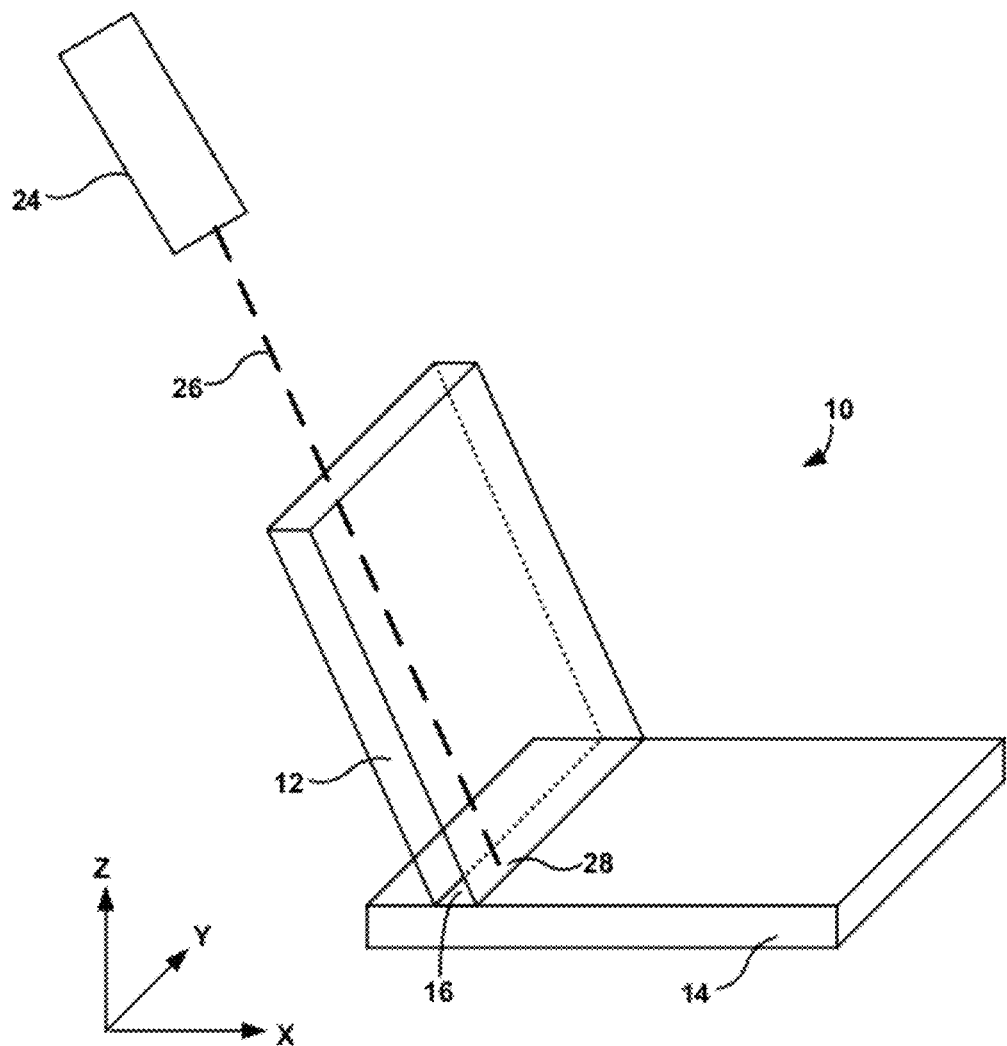
FIG. 6 is a conceptual illustration of another example processing step that may be performed while implementing the example process of FIG. 2
Figure 7A:
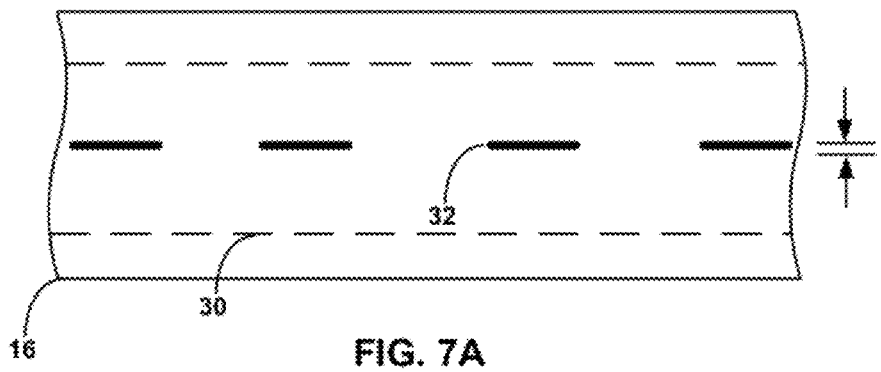
FIGS. 7A-7C are plan view schematic drawing of different example patterns that a laser beam may traverse while implementing the example process of FIG. 2.
Figure 7B:
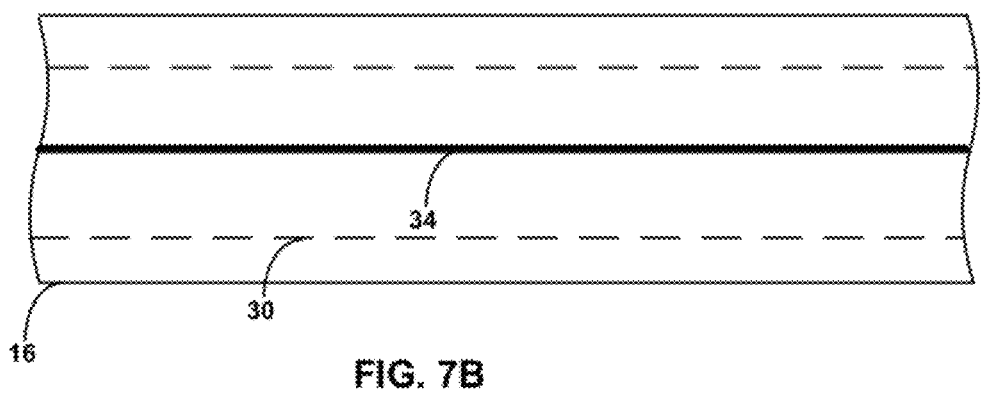
Figure 7C:
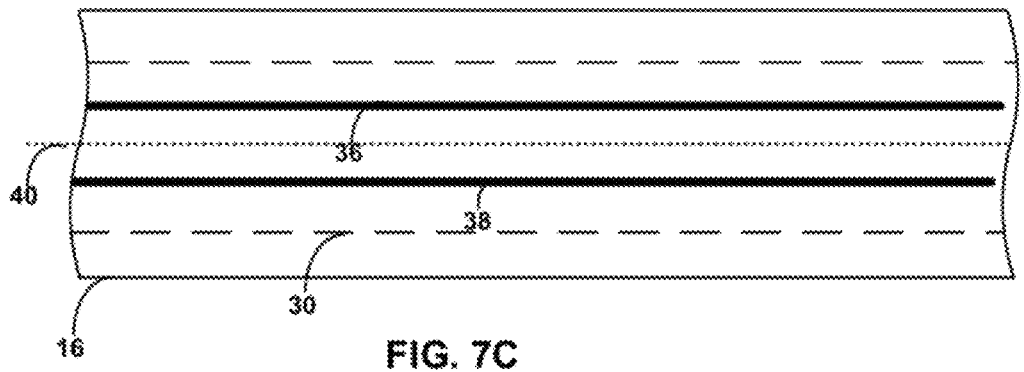

FIG. 2 is a flow diagram illustrating an example process in accordance with the disclosure that may be used to bond first substrate 12 to second substrate 14. For ease of description, the example of FIG. 2 will be described with reference FIGS. 3-7. FIGS. 3, 5, and 6 are conceptual illustrations of example processing steps that may be performed while implementing the example technique of FIG. 2. FIGS. 3, 5, and 6 each depict an example cutaway portion of article 10 (FIGS. 1A and 1B). FIGS. 4A and 4B illustrate example reaction mechanisms that may occur while directly bonding two substrates together using the example technique of FIG. 2. FIGS. 7A-7C are plan view schematic illustrations of different example patterns that a laser beam may traverse while implementing the example technique of FIG. 2.

The process of directly bonding two or more substrates together to form a unified structure may include preparing the contact surfaces of the substrates and placing the substrates in contact with one another to establish a direct bond between the substrates. FIG. 3 illustrates first substrate 12 being placed in contact with second substrate 14. First substrate 12 defines a first surface 20 and second substrate 14 defines a second surface 22. First surface 20 of first substrate 12 is placed in contact with second surface 22 of second substrate 14 by moving first substrate 12 in the Z-X plane, as indicated by the extension lines projecting from first surface 20 in FIG. 3.

To create a direct bond between first surface 20 and second surface 22, first surface 20 and/or second surface 22 may be prepared for direct bonding before placing first surface 20 in contact with second surface 22. Surface preparation may enable different atoms or molecules of first surface 20 and second surface 22 to attract one another. These attractive forces may create a direct bond between first substrate 12 and second substrate 14.

The type of surface preparation performed on first surface 20 and second surface 22 may vary, e.g., based on the chemical composition of first substrate 12 and second substrate 14. However, in some examples, first surface 20 and second surface 22 may be prepared by polishing first surface 20 and second surface 22 (50) (FIG. 2). Surface polishing may remove surface deformities on first surface 20 and second surface 22. Surface deformities may include burrs, gouges, ridges, or other irregularities extending in or out of the plane of first surface 20 and/or second surface 22 (i.e., the plane where first surface 20 contacts second surface 22). Removing the surface deformities may provide smooth surfaces (e.g., surfaces with low surface roughness values) for placing first surface 20 in intimate contact with second surface 22.

Different techniques may be used to polish first surface 20 and second surface 22 (50). In one example, first surface 20 and second surface 22 may be mechanically polished. Mechanical polishing may involve contacting first surface 20 and second surface 22 with an abrasive article and moving the abrasive article relative to first surface 20 and second surface 22. The abrasive article may wear away a portion of first surface 20 and second surface 22, thereby removing surface deformities on first surface 20 and second surface 22. In different examples, an abrasive article may include a slurry of abrasive particles, a bonded abrasive article (e.g., a grinding stone), a coated abrasive article (e.g., sand paper), or the like.

In another example, first surface 20 and second surface 22 may be chemically polished. Chemical polishing may involve exposing first surface 20 and second surface 22 to a chemical solution. One or more components of the solution may react with first surface 20 and second surface 22. The reaction may add material to first surface 20 and second surface 22, or the reaction may remove material from first surface 20 and second surface 22. In either case, the reaction may remove surface deformities from first surface 20 and second surface 22.

In still another example, first surface 20 and second surface 22 may be polished using a combination of chemical and mechanical polishing techniques. For example, first surface 20 and second surface 22 may be polished using chemical-mechanical polishing (CMP) techniques (also referred to as chemical-mechanical planarization techniques). Generally speaking, chemical-mechanical polishing may involve exposing first surface 20 and second surface 22 to a slurry that includes an abrasive agent and a chemical agent. A polishing pad may polish first surface 20 and second surface 22 with the slurry to remove surface deformities from first surface 20 and second surface 22

Independent of the specific technique used to polish first surface 20 and second surface 22 (50), first surface 20 and second surface 22 may each be polished using the same technique, or first surface 20 and second surface 22 may be polished using different techniques or different polishing parameters.

In some examples, one or both of first surface 20 and second surface 22 may be polished until the surfaces exhibit comparatively low surface roughness values. Polishing first surface 20 and second surface 22 until the surfaces exhibit comparatively low surface roughness values may enhance direct bond formation because the atomic forces that cause direct bond formation may be stronger as the distance between first surface 20 and second surface 22 reduces.

In some examples, first surface 20 and/or second surface 22 may be polished until first surface 20 and/or second surface 22 exhibits an average surface roughness (Ra) less than approximately 1 nanometer such as, e.g., less than approximately 0.5 nanometers, or less than 0.25 nanometers. In some examples, polishing both first surface 20 and second surface 22 until the two surfaces exhibit an average surface roughness (Ra) less than approximately 1 nanometer may facilitate direct bonding between the two surfaces. The smooth surfaces may allow first surface 20 to be placed in close contact with second surface 22 (e.g., within a few nanometers of one another). Once in close contact, atomic forces (e.g., Van der Waals forces) may cause electrical interaction between the atoms or molecules of the two surfaces. This electrical interaction may create a direct bond between first substrate 12 and second substrate 14.

While smoother surfaces generally facilitate improved direct bond formation by allowing atoms or molecules of different surfaces to come into close contact, in some examples according to the disclosure, comparatively rough surfaces may be bonded together. As described in greater detail below, the process of bonding two substrates together according to the present disclosure may involve directly bonding two substrates together and, thereafter, laser treating the direct bond to strengthen the bond. As a result of this subsequent laser treatment, comparatively rougher surfaces may, in some examples, initially be bonded together without substantially affecting the overall strength of the final bond formed between the two substrates. The subsequent laser treatment may compensate for a weak direct bond formed between two substrates that have comparatively higher surface roughness valves. As such, first surface 20 and second surface 22 may, in some examples, be polished to a lesser extent than if first surface 20 and second surface 22 were being bonded together without laser treatment. For example, in some applications, first surface 20 and/or second surface 22 may be polished to an average surface roughness (Ra) greater than approximately 1 nanometers, such as, e.g., greater than approximately 2 nanometers, or even greater than approximately 2.5 nanometers.

In addition to or in lieu of surface polishing (50), first surface 20 and second surface 22 may be prepared for direct bonding by chemically activating one or both of first surface 20 and second surface 22 (52) (FIG. 2). Chemical activation may increase the number of chemical bonding sites available on first surface 20 and second surface 22. Chemical activation may also change the surface energy of first surface 20 and second surface 22. In either case, chemical activation may promote direct bond formation between first substrate 12 and second substrate 14 when first surface 20 is brought into contact with second surface 22.

The type of chemical activation performed on first surface 20 and/or second surface 22 may vary based on a variety of factors such as, e.g., the types of chemical bonds to be formed between first surface 20 and second surface 22, and the chemical composition of first substrate 12 and second substrate 14. In some examples, however, chemical activation may involve exposing first surface 20 and second surface 22 to a plasma gas. For example, first surface 20 and second surface 22 may be exposed to a nitrogen plasma or an oxygen plasma, although other plasma gases may be used. Exposing first surface 20 and second surface 22 to a plasma gas may increase the surface potential energy of first surface 20 and second surface 22 by modifying the local atomic and electronic structure in the first several atomic layers of the material.

In some examples, a plasma treatment may involve an RF nitrogen plasma generated at room temperature, a pressure between approximately 200 mTorr and approximately 400 mTorr, and an RF power less than approximately 150 Watts. However, other types of plasma treatments are both possible and contemplated, and it should be appreciated that the disclosure is not limited in this respect.

While chemically activating first surface 20 and second surface 22 (52) may involve a plasma treatment in some examples, in other examples, first surface 20 and second surface 22 may be activated by treating first surface 20 and second surface 22 with different types of chemical compounds. For example, in some applications, first surface 20 and second surface 22 may be activated to promote hydrogen bonding between first surface 20 and second surface 22 when first surface 20 is brought into contact with second surface 22. Hydrogen bonding may provide an attractive force between first surface 20 and second surface 22 that directly bonds first substrate 12 to second substrate 14.

In general, first surface 20 and second surface 22 may be activated to promote hydrogen bonding by adding a hydrogen-bearing functional group to the chemical structure of the materials used to fabricate first substrate 12 and second substrate 14. A hydrogen atom of the hydrogen-bearing functional group may be attached to a relatively electronegative atom, which serves as the hydrogen bond donor for hydrogen bonding. When first surface 20 is subsequently brought into intimate contact with second surface 22, an electronegative atom on one surface may electrically interact with a hydrogen atom on the other surface, establishing an intermolecular bond between first surface 20 and second surface 22.

In addition to or in lieu of surface polishing (50) and chemical activation (52), first surface 20 and second surface 22 may be prepared for direct bonding by cleaning first surface 20 and second surface 22 (54) (FIG. 2). Surface cleaning may remove particles and contaminates from first surface 20 and second surface 22 that may otherwise inhibit direct bond formation when first surface 20 is brought into contact with second surface 22.

First surface 20 and second surface 22 may be cleaned using any suitable technique. In one example, first surface 20 and/or second surface 22 may be cleaned using a spin rinse dryer (SRD). During operating, the spin rinse dryer may rinse first substrate 12 and/or second substrate 14 with a cleaning solution, spin the substrate to centrifugally dry the substrate, and further dry the substrate with a heat source such as, e.g., heated nitrogen. In another example, first surface 20 and/or second surface 22 may be ultrasonically cleaned. During ultrasonic cleaning, first substrate 12 and/or second substrate 14 may be placed in a bath of cleaning solution and bombarded with high frequency acoustic waves. The high frequency acoustic waves may induce cavitation bubbles that contact contaminates on the substrate, thereby cleaning first surface 20 and/or second surface 22. Other cleaning methods or combinations of cleaning methods are possible.

First surface 20 and second surface 22 may be cleaned with a variety of different cleaning solutions and the type of cleaning solution used may vary, e.g., based on the chemical composition of first substrate 12 and second substrate 14, and the types of contaminates on first surface 20 and second surface 22. In some examples, a cleaning solution for first surface 20 and/or second surface 22 may be as simple as water (e.g., deionized water). In other examples, a cleaning solution may include ammonium hydroxide, hydrogen peroxide, or the like. In still other examples, a cleaning solution may be a SC1 and/or SC2 cleaning solution, as may be employed in the semiconductor wafer industry. Other cleaning solutions may also be used.

Cleaning first surface 20 and second surface 22 (54) (FIG. 2) may function to remove contaminates that may otherwise inhibit direct bond formation when first surface 20 is brought into intimate contact with second surface 22. Organic compounds such as, e.g., organic processing films (such as oils) present on first surface 20 or second surface 22 are one type of contaminate that may inhibit direct bond formation. As such, in some examples, first surface 20 and/or second surface 22 may be cleaned such that first surface 20 and/or second surface 22 are substantially free of organic films. Loose particulate matter such as, e.g., particulate matter sheared off first surface 20 or second surface 22 during processing, is another type of contaminate that may inhibit direct bond formation. Accordingly, in some additional examples, first surface 20 and/or second surface 22 may be cleaned such that first surface 20 and/or second surface 22 are substantially free of particulate matter. For example, in some applications, first surface 20 and/or second surface 22 may be cleaned such that first surface 20 and/or second surface 22 are substantially free of particles greater than approximately 10 nanometers such as, e.g., particles greater than approximately 50 nanometers, or particles greater than 100 nanometers (i.e., 0.1 micrometers).

First surface 20 and/or second surface 22 may be prepared for direct bonding using additional or different processing steps beyond surface polishing (50), surface activation (52), and surface cleaning (54) (FIG. 2). Independent of the specific techniques used, after suitably preparing first surface 20 and second surface 22 for direct bonding, first surface 20 may be brought into contact with second surface 22 to establish a direct bond between first substrate 12 and second substrate 14 (56) (FIG. 2).

First surface 20 may be brought into intimate contact with second surface 22 to establish a direct bond between first surface 20 and second surface 22. In general, the forces of attraction that create a direct bond between first substrate 12 and second substrate 14 may increase as the distance between first substrate 12 and second substrate 14 decreases. Therefore, to directly bond first substrate 12 to second substrate 14, first substrate 12 may be moved to place first surface 20 in close proximity to second surface 22. In some examples, first substrate 12 may be moved such that first surface 20 is less than approximately 5 nanometers from second surface 22, e.g., less than approximately 2 nanometers from second surface 22. In this manner, first substrate 12 and second substrate 14 may be brought into close proximity to establish a direct bond.

Without being bound by any particular theory, it is believed that as first surface 20 is brought into close proximity to second surface 22 atomic forces (e.g., Van der Waals forces) may cause electrical interaction between the atoms or molecules of the two surfaces. In some examples, intermolecular hydrogen bonding may also occur between different molecules on the surfaces of first substrate 12 and second substrate 14. In either case, the different forces may attract first surface 20 to second surface 22 to create a direct bond between first substrate 12 and second substrate 14. The forces may also cause covalent bonds to form between the different atoms or molecules of first surface 20 and second surface 22. The covalent bonds may provide a stronger direct bond between first surface 20 and second surface 22 than a direct bond formed by atomic attractive forces alone.

As will be described in greater detail below, heating first substrate 12 and second substrate 14 may, in some examples, promote covalent bond formation between first surface 20 and second surface 22 by providing energy to overcome an activation energy barrier for covalent bond formation. In some examples according to the present disclosure, a direct bond formed between first surface 20 and second surface 22 may be heated by directing a laser on at least a portion of contact location 16 between first surface 20 and second surface 22. The laser energy may heat the direct bond between first surface 20 and second surface 22, causing covalent bonds to form between the two surfaces.

In any event, a direct bond between first surface 20 and second surface 22 may hold first substrate 12 and second substrate 14 in a substantially fixed arrangement relative to one another. A direct bond may also increase the amount of force necessary to separate first substrate 12 from second substrate 14 as compared to when no direct bond is formed between first substrate 12 and second substrate 14. For example, a direct bond formed between first surface 12 and second substrate 14 before laser treatment may exhibit an interfacial fracture toughness less than approximately 0.3 megapascal square root meter (MPa*SQRT(m)) when the direct bond is heated to a temperature less than approximately 400 degrees Celsius (e.g., when the direct bond is not heated above ambient temperature).

At the molecular level, different reactions may occur to directly bond first substrate 12 to second substrate 14. Further, the specific reaction mechanism at work may vary, e.g., based on the specific chemical composition of first substrate 12 and second substrate 14, and processing steps performed on first substrate 12 and second substrate 14 to prepare the substrates for direct bonding. That being said, FIGS. 4A and 4B schematically illustrate example reaction mechanisms that may occur during the formation of a direct bond between first substrate 12 and second substrate 14. FIG. 4A illustrates an example reaction mechanism for directly bonding two hydrophobically activated surfaces. FIG. 4B illustrates an example reaction mechanism for directly bonding two hydrophilically activated surfaces. FIGS. 4A and 4B each illustrate two substrates that include silicon being directly bonded together. However, other materials can be bonded together in accordance with the disclosure, and it should be appreciated that the techniques of the disclosure are not limited in this respect.

As shown in FIG. 4A, a reaction pathway for directly bonding two hydrophobically activated surfaces may include preparing the two surfaces such that the surfaces are oxide free and terminated by hydrogen atoms attached to relatively electronegative atoms, which in FIG. 4A is illustrated as a hydrogen atom attached to a fluorine atom (70). The surfaces may be brought into close contact to establish weak hydrogen bonds between the two surfaces (72). Thereafter, the two surfaces may be annealed (i.e., heated) to release hydrogen gas and to create a covalent Si—Si bond between the two surfaces (74). In this manner, the two hydrophobically activated surfaces may be directly bonded to one another.

As shown in FIG. 4B, a reaction pathway for directly bonding two hydrophylically activated surfaces may include preparing the two surfaces such that the surfaces are terminated hydroxyl groups (76). Hydroxyl groups attract water so that the surfaces are hydrophilic. The surfaces may be brought into close contact to establish weak hydrogen bonds between the two surfaces (78). Thereafter, the two surfaces may be annealed to release water and establish a covalent Si—O—Si bond between the two surfaces (80). In this manner, the two hydrophylically activated surfaces may be directly bonded to one another.

Direct bonding (56) (FIG. 2) may occur under various pressure conditions. For example, a direct bond may be formed between first substrate 12 and second substrate 14 at vacuum pressure, at atmospheric pressure (i.e., ambient pressure), or at an elevated pressure. Where two or more substrates define a cavity (e.g., article 10 in FIG. 1), the pressure conditions under which the direct bond is formed may establish the pressure conditions in the cavity for the service life of the article. Therefore, the internal pressure of an article may be established during a bonding process according to the disclosure.

FIGS. 3 and 5 provide example macro level conceptual illustrations of first substrate 12 being placed in contact with second substrate 14 to establish a direct bond between the two substrates. As depicted in the example of FIG. 3, first surface 20 of first substrate 12 is placed in contact with second surface 22 of second substrate 14 by moving first substrate 12 in the Z-X plane, as indicated by the extension lines projecting from first surface 20 in FIG. 3. As further depicted in FIG. 5, first surface 20 contacts second surface 22 at contact location 16. A direct bond is established between first surface 20 and second surface 22 along at least a portion of contact location 16, as generally described above with reference to the example of FIGS. 4A and 4B.

Contact location 16 is defined where first surface 20 of first substrate 12 contacts second surface 22 of second substrate 14. Generally speaking, first substrate 12 may either be directly bonded to second substrate 14 along the entire area defined by contact location 16 or first substrate 12 may be directly bonded to second substrate 14 along one or more lesser portions of the area defined by contact location 16. The amount of area defined by contact location 16 over which a direct bond forms between first substrate 12 and second substrate 14 may be controlled, e.g., by selectively preparing (e.g., polishing, activating, cleaning) certain portions of first surface 20 and second surface 22 for direct bonding while leaving other portions of first surface 20 and second surface 22 unprepared. A direct bond may not form between unprepared areas of first surface 20 and second surface 22 when the two surfaces are brought into intimate contact.

With further reference to FIG. 2, the process of forming a bond between two or more substrates in accordance with the present disclosure may include, subsequent to directly bonding two surfaces together (56), heating the bonded surfaces (58). Heating may provide energy to overcome an activation energy barrier for forming covalent bonds between first substrate 12 and second substrate 14. In this respect, heating may strengthen a direct bond (e.g., a direct bond formed by Van der Waals forces) between first substrate 12 and second substrate 14 by forming covalent bonds between first substrate 12 and second substrate 14.

In some examples, the strength of a direct bond may be proportional to the amount of thermal energy supplied while forming the direct bond. For instance, in some examples, heating a direct bond to temperatures greater than 500 degrees Celsius such as, e.g., greater than 800 degrees Celsius may result in significant improvements in bond strength as compared to when the direct bond is not heated or heated to lower temperatures. Accordingly, in some examples, the bonding techniques of the present disclosure may include heating a direct bond formed between first substrate 12 and second substrate 14 to a temperature greater than approximately 350 degrees Celsius such as, e.g., a temperature greater than approximately 500 degrees Celsius or even greater than approximately 750 degrees Celsius. Heating may be accomplished by placing first substrate 12 and second substrate 14 in an oven, placing first substrate 12 and second substrate 14 between heated platens, or by using any other suitable technique to heat first substrate 12 and second substrate 14.

While heating two or more substrates connected by a direct bond may strengthen the direct bond between the substrates, the heating process may affect other features thermally connected to the substrates. For example, as described with respect to FIGS. 1A and 1B, first substrate 12 and second substrate 14 may define a cavity that houses a thermally sensitive component 18. In these examples, heating first substrate 12 and second substrate 14 above a certain temperature to strengthen a direct bond between the substrates may also heat component 18 housed by the substrates. This heating may damage component 18. On the other hand, reducing the temperature at which first substrate 12 and second substrate 14 are heated may reduce the strength of the bond between the two substrates.

In accordance with some examples of the present disclosure, however, heating of first substrate 12 and second substrate 14 may be reduced or eliminated by directing a laser on at least a portion of the direct bond initially formed between first substrate 12 and second substrate 14. As will be described in greater detail below, the laser may provide localized heating to the bond between first substrate 12 and second substrate 14. Localized heating may provide heat that is substantially thermally isolated from any potential thermally sensitive features (e.g., component 18). This contrasts with bulk heating of first substrate 12 and second substrate 14, where the substrates and any potentially thermally sensitive features (e.g., component 18) may be placed in an oven to strengthen the direct bond between the substrates.

Because the bonding techniques of the disclosure may reduce or eliminate direct bond heating before laser treatment, a direct bond formed before laser treatment may, in some examples, be heated to temperatures lower than those temperatures indicated above for strengthening. In one example, a direct bond may be formed between first substrate 12 and second substrate 14 at ambient temperatures (e.g., less than approximately 35 degrees Celsius) without any additional heating prior to laser treatment. In another example, a direct bond may be formed between first substrate 12 and second substrate 14 and the substrates may be heated (e.g., below a temperature that may damage a thermally sensitive feature) to strengthen the bond between the substrates.

In one example, first substrate 12 and second substrate 14 may be heated to a temperature less than approximately 350 degrees Celsius such as, e.g., a temperature less than approximately 100 degrees Celsius. In another example, first substrate 12 and second substrate 14 may be heated to a temperature between approximately 50 degrees Celsius and approximately 250 degrees Celsius such as, e.g., a temperature between approximately 75 degrees Celsius and approximately 150 degrees Celsius. Heating may be accomplished by placing first substrate 12 and second substrate 14 in an oven or by using any other suitable technique to heat first substrate 12 and second substrate 14.

The process of bonding first surface 20 to second surface 22 in the example of FIG. 2 includes, subsequent to directly bonding the surfaces together (56) and optionally heating the surfaces (58), directing a laser on at least a portion of contact location 16 that includes the direct bond formed between the surfaces (60). FIG. 6 is a conceptual illustration of an example technique that may be used to direct a laser on a direct bond formed between first substrate 12 and second substrate 14. In particular, FIG. 6 illustrates laser 24 directing laser beam 26 though first substrate 12 onto contact location 16. Contact location 16 includes a direct bond formed between first substrate 12 and second substrate 14. During operation, laser beam 26 may traverse across at least a portion of a length of contact location 16 (e.g., a length in the Z-Y plane, Z-X plane, or both the Z-Y and Z-X planes indicated on FIG. 6) to strengthen the direct bond between first substrate 12 and second substrate 14.

In the example of FIG. 6, first substrate 12 is substantially transparent to a wavelength of laser beam 26 and second substrate 14 is substantially opaque to the wavelength of laser beam 26. Laser beam 26 transmits through first substrate 12 until reaching second substrate 14 at contact location 16. Second substrate 14 may thereafter absorb the energy from laser beam 26. The absorbed laser energy may heat second substrate 26 in the region proximate where laser beam 26 is directed. In other words, directing laser beam 26 along contact location 16 may heat second substrate 26 in the region proximate contact location 16. In this manner, laser beam 26 may heat a direct bond previously formed between first substrate 12 and second substrate 14 along contact location 16.

Heating may cause covalent bonds to form between the atoms or molecules of first substrate 12 and second substrate 14. For example, heating may supply energy sufficient to overcome an activation energy barrier for covalent bond formation between first substrate 12 and second substrate 14. Covalent bonds between first substrate 12 and second substrate 14 may provide a stronger direct bond between the two substrates than a direct bond formed by intermolecular force (e.g., Van der Waals forces) alone.

As discussed in greater detail below, laser beam 26 may provide localized heating to the region proximate contact location 16. For example, depending on the type of laser beam used, laser beam 26 may heat contact location 16 to a temperature between approximately 900 degrees Celsius and approximately 1200 degrees Celsius. In some examples, these temperatures may not extend beyond approximately 200 microns, such as, e.g., beyond approximately 100 microns, on either side of the interface between first substrate 12 and second substrate 14. In this manner, laser beam 26 may be used to provide localized heating to contact location 16. Localized laser heating may allow a direct bond between first substrate 12 and second substrate 14 to be strengthened without damaging any thermally sensitive materials or components.

Laser 24 generates laser beam 26 during operation. A variety of different types of lasers can be used as laser 24. Selection of a specific type of laser for laser 24 may be based, e.g., on the wavelength of light generated by the laser. For example, laser 24 may be selected to provide a wavelength of light that is substantially transparent to first substrate 12 and substantially opaque to second substrate 14. In some examples, laser 24 may provide laser beam 26 in the ultraviolet spectrum, visible spectrum, or near infrared spectrum. Other spectra may also be used. Example lasers that may be used as laser 24 include: a solid state YAG laser (e.g., an Nd:YAG laser), a fiber laser (e.g., a YB fiber laser), a fiber-delivered diode laser, a Ti:sapphire laser, an Ar ion laser, a XeF laser, an Alexandrite laser, a HeNe laser, a Dye laser, a GaAs/AlGaAs laser, an InGaAs laser, an InGaAsP laser, and/or a Nd:glass laser. The foregoing lasers are only examples, however, and it should be appreciated that the bonding techniques of the disclosure are not limited to the use of any particular type of laser.

Laser 24 may be capable of delivering laser beam 26 as a pulsed laser beam or as a continuous wave laser beam. In general, a direct bond may be heated and strengthened using either type of laser beam or combinations of both types of laser beams. In some examples, the use of a continuous laser beam may reduce local thermal gradients and the potential for thermal shock as compared to when a pulsed laser beam is used. Thermal shock may generate thermal fractures in a substrate on which laser beam 26 is directed.

Laser beam 26 may define laser beam spot 28 when laser beam 26 is directed onto second substrate 14. Laser beam spot 28 may define any suitable size (i.e., any suitable cross-sectional area in the X-Y plane illustrated in FIG. 6). In general, a larger laser beam spot 28 may heat a larger area, and hence strengthen a direct bond over a larger area, than a comparatively smaller laser beam spot size. In this respect, controlling the size of laser beam spot 28 may control where contact location 16 is heated. Selectively controlling where contact location 16 is heated may provide control to form and strengthen a direct bond between first substrate 12 and second substrate 14 at a selected location.

In some examples, laser beam spot 28 may define a substantially circular shape (i.e., in the X-Y plane in FIG. 6). The substantially circular shape may have a diameter that ranges from less than approximately 20 micrometers to greater than approximately 200 micrometers. For example, the substantially circular shape may have a diameter that ranges from between approximately 20 micrometers to approximately 200 nanometers. Other sizes and shapes are also contemplated.

In operation, laser beam 26 may be directed onto contact location 16 to heat a previously-established direct bond between first substrate 12 and second substrate 14. In some examples, laser beam 26 may traverse across at least a portion of a length of contact location 16 (e.g., a length in the X-Y plane indicated on FIG. 6) to heat the direct bond between first substrate 12 and second substrate 14 over a larger area of contact location 16 than if laser beam 26 remains stationary on one portion of contact location 16.

FIGS. 7A-7C are plan view schematic illustrations of different example patterns that laser beam 26 may follow while traversing across contact location 16. FIGS. 7A-7C each illustrate contact location 16, which is defined where first substrate 12 contacts second substrate 14. A direct bond 30 (defined as the area between the dashed lines in FIGS. 7A-7C) is formed between first substrate 12 and second substrate 14. Direct bond 30 in the example of FIGS. 7A-7C is formed over less than the entire area defined by contact location 16. In other examples, however, direct bond 30 may be formed over the entire area defined by contact location 16.

FIG. 7A schematically illustrates an example discontinuous pattern that laser beam spot 28 of laser beam 26 may traverse over to heat direct bond 30. The pattern includes a plurality of straight laser beam paths 32 that substantially follow a centerline of direct bond 30. Laser beam spot 28 may traverse over paths 32 to heat and strengthen direct bond 30 proximate paths 32. For example, laser beam 26 may heat direct bond 30 to a temperature between approximately 700 degrees Celsius and approximately 1500 degrees Celsius along paths 32 where laser beam spot 28 is directed. Regions greater than approximately 100 microns, such as, e.g., greater than 200 microns from paths 32 may remain at substantially ambient temperature. In some examples, this may produce a plurality of laser-strengthened direct bonds formed within the larger area defined by direct bond 30. The laser-strengthened direct bonds may be defined as regions with covalent bonds between first substrate 12 and second substrate 14, while the area of direct bond 30 outside of the laser-strengthened direct bonds may be defined as a region with intermolecular (e.g., Van der Waals) bonds between first substrate 12 and second substrate 14.

FIG. 7B schematically illustrates an example of a continuous pattern that laser beam spot 28 of laser beam 26 may traverse over to heat direct bond 30. The continuous pattern includes a straight laser beam path 34 that substantially follows a centerline of direct bond 30. Laser beam spot 28 may traverse over path 34 to heat direct bond 30 proximate path 34. In some examples, laser beam 26 may heat the region along path 34 while regions disposed away from path 34 may remain at substantially ambient temperatures. In some examples, this may produce a laser-strengthened direct bond formed within the larger area defined by direct bond 30.

FIG. 7C schematically illustrates another example pattern that laser beam spot 28 of laser beam 26 may traverse over to heat direct bond 30. The pattern includes two continuous laser beam paths 36 and 38 that are offset from a centerline 40 of direct bond 30. Laser beam spot 28 may traverse over paths 36 and 38 to heat direct bond 30 proximate paths 36 and 38. In some examples, laser beam 26 may heat the region along paths 36 and 38 while regions disposed away from paths 36 and 38 may remain at substantially ambient temperatures. In some examples, this may produce a pair of laser-strengthened direct bonds formed within the larger area defined by direct bond 30.

Laser beam 26 may follow patterns other than those discussed above with respect to FIGS. 7A-7C while traversing across contact location 16. In one example, laser beam 26 may traverse over substantially the entire area defined by direct bond 30. Traversing laser beam 26 over substantially the entire area defined by direct bond 30 may heat substantially the entire area defined direct bond 30. In another example, laser beam 26 may be traversed over direct bond 30 while intermittently being turned on and off. This may heat a plurality of discrete spots on direct bond 30, where each of the discrete spots correspond to areas where laser beam spot 28 was activated. In still other examples, laser beam 26 may be traversed to define curved lines, zigzag patterns, crossing lines, or any other pattern. Therefore, although FIGS. 7A-7C illustrate straight, non-overlapping patterns for laser beam 26, in different examples, laser beam 26 may be used to heat any continuous or discontinuous patterns on direct bond 30.

In some examples, directing laser beam 26 to heat direct bond 30 in an interrupted pattern (e.g., thus creating laser-enhanced direct bonds between areas of direct bond 30 that are not laser-enhanced) may produce to a direct bond that exhibits greater apparent strength in an opening fracture mode as compared to a direct bond created by continuously directing laser beam 26 on direct bond 30. In some examples, directing laser beam 26 to heat direct bond 30 in a continuous pattern (e.g., thereby creating an uninterrupted laser-enhanced direct bond) may produce a directly bonded article that exhibits greater biostability and hermeticity as compared to a directly bonded article that created by directing laser beam 26 to heat direct bond 30 in an interrupted pattern.

During operation of laser 24, laser beam 26 delivers energy to contact location 16 to heat contact location 16 to strengthen the direct bond between first substrate 12 and second substrate 14. The amount of energy laser 24 delivered to contact location 16 may vary, e.g., based on the intended strength of the bond being formed and the chemical composition of first substrate 12 and second substrate 14. Controlling the amount of energy laser 24 delivers to contact location 16 may be useful to control the amount of heat generated at contact location 16. In general, contact location 16 is heated to a lower temperature when less energy is delivered to contact location 16 than when a comparatively higher energy is delivered to contact location 16. Heating contact location 16 to comparatively lower temperatures may reduce or eliminate thermal damage (e.g., melting or cracking) to first substrate 12 and second substrate 14. However, heating contact location 16 to a higher temperature may produce a stronger direct bond between first substrate 12 and second substrate 14 than when contact location 16 is heated to a comparatively lower temperature.

In accordance with the techniques of the present disclosure, laser 24 may, in some examples, deliver between approximately 1 Joule per square millimeter and approximately 8 Joules per square millimeter. For example, laser 24 may deliver between approximately 2 Joules per square millimeter and approximately 6 Joules per square millimeter. Other laser energies are both contemplated and possible.

In some examples, using laser 24 to deliver between approximately 1 Joule per square millimeter and approximately 8 Joules per square millimeter may heat first substrate 12 and second substrate 14 in the area proximate to contact location 16 to a temperature between approximately 900 degrees Celsius and approximately 1200 degrees Celsius. These temperatures may cause covalent bonds to form between first substrate 12 and second substrate 14. Furthermore, in some examples, these temperatures may be below a melting point of first substrate 12 and/or second substrate 14. As a result, a direct bond between first substrate 12 and second substrate 14 may be strengthen without melting first substrate 12 and/or second substrate 14. A direct bond formed between first substrate 12 and second substrate 14 without melting either first substrate 14 or second substrate 14 may be stronger than a direct bond form by melting either first substrate 14 or second substrate 14. Melting may reduce the mechanical strength of first substrate 12 and/or second substrate 14 in the region adjacent the direct bond.

In some examples, localized laser heating following direct bonding, in accordance with the present disclosure, may allow two substrates with different coefficients of thermal expansion to be directly bonded together. For example, in some applications, a difference in a coefficient of thermal expansion between first substrate 12 and a coefficient of thermal expansion for second substrate 14 may be greater than approximately 20 percent. In these examples, bulk heating of first substrate 12 and second substrate 14 (e.g., by placing the two substrates in an oven, or by placing the substrates between heated platens) followed by cooling back to ambient temperatures may cause stress at the interface between first substrate 12 and second substrate 14. Stress at the interface between first substrate 12 and second substrate 14 may reduce the strength of a bond between first substrate 12 and second substrate 14.

In contrast, localized laser heating following direct bonding, in accordance with the present disclosure, may reduce or eliminate thermal cycling (e.g., heating and cooling) of first substrate 12 and second substrate 14 by limiting heat to a region proximate contact location 16. Limiting heat to a region proximate contact location 16 may reduce or eliminate thermal stress between first substrate 12 and second substrate 14.

In some additional examples, localized laser heating following direct bonding, in accordance with the present disclosure, may eliminate or reduce the number of thermal defects created in first substrate 12 and second substrate 14 proximate contact location 16 relative to bonding techniques that rely on laser heating alone. For example, in applications that use a laser to melt-bond two substrates without first creating a direct bond between the substrates, thermal defects may appear in a region proximate to where the substrates are bonded together. Thermal defects may include evidence of melting (e.g., viscous flow), cracks, disturbance to a crystal structure of one or both of the bonded substrates, or the like. By contrast, some articles created according to the techniques of the present disclosure may be characterized in that the articles are substantially free of thermal defects in a region proximate to contact location 16. Without wishing to be bound by any particular theory, it is believed that, in some examples, laser 24 (FIG. 6) may strengthen a direct bond between first substrate 12 and second substrate 14 while delivering a lower laser energy than a laser energy required to melt-bond first substrate 12 and second substrate 14. A lower laser energy may heat a region proximate to contact location 16 to a lower temperature than a higher laser energy, which may reduce or eliminate thermal defects in the region proximate contact location 16.

An article that includes a direct bond formed between two substrates in accordance with the techniques of this disclosure may exhibit a number of unique characteristics. In some examples, an article that includes a direct bond formed according to this disclosure may exhibit a visible heat-affected region in an area proximate to the direct bond when viewing the direct bond through a differential interference contrast microscope. The heat-affected region may not be visible when viewing the same area proximate to the direct bond with a bright field optical microscope.

Figures 8A, 8B, 8C:
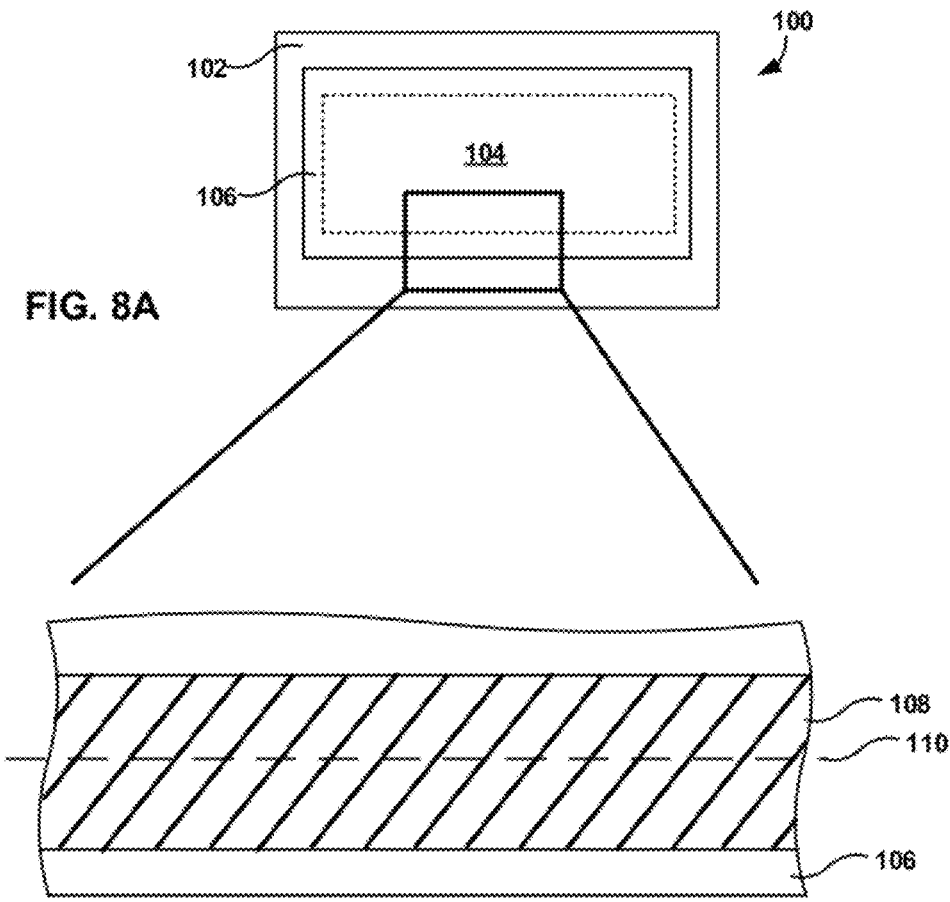
FIG. 8A is a schematic drawing of an example article that includes two substrates directly bonded together using the techniques of the disclosure.
FIG. 8B is an example conceptual view of an exploded section of the direct bond of the article illustrated in FIG. 8A, as the bond may appear under a differential interference contrast microscope.
FIG. 8C is an example conceptual view of an exploded section of the direct bond of the article illustrated in FIG. 8A, as the bond may appear under a bright field optical microscope.

FIG. 8A is a plan view schematic of an example article 100 that includes a first substrate 102 and a second substrate 104. First substrate 102 is directly bonded to second substrate 104 according to the techniques of the disclosure along direct bond 106 (represented as the area between the outer perimeter of second substrate 104 and the dashed line illustrated on FIG. 8A). First substrate 102 and second substrate 104 may be formed from the same materials discussed above with respect to first substrate 12 and second substrate 14.

FIG. 8B is an example conceptual view of an exploded section of direct bond 106 as the bond may appear under a differential interference contrast microscope. In particular, FIG. 8B illustrates an exploded section of direct bond 106 as direct bond 106 may appear when viewing the bond through first substrate 102 (e.g., in a plan view). As depicted in the example of FIG. 8B, heat-affected region 108 is visible when viewing direct bond 108 with a differential interference contrast microscope. In some examples, heat-affected region 108 may be visibly distinguished from other areas adjacent to heat-affected region 108 in that the edges of heat-affected region 108 may appear in a contrasting color or brightness to the other adjacent areas (i.e., when viewed under polarized light or using differential interference contrast).

Heat-affected region 108 may be created when laser beam 26 (FIG. 6) is directed onto direct bond 106 to strengthen the direct bond. In this regard, in some examples, heat-affected region 108 may be present in areas that were heated by laser beam 26 but may be absent from areas that were not heated by laser beam 26. Heat-affected region 108 may be visible using differential interference contrast microscopy due to a change in the optical path length within the heat-affected region caused by a local change in the index of refraction. Depending on the types of materials being bonded, this local change in the index of refraction may be attributable to atomic microsegregation in material that is substantially transparent to the wavelength of the laser, or microphase immiscibility in the material that is substantially transparent to the wavelength of the laser.

Because heat-affected region 108 may be created when laser beam 26 is directed onto direct bond 106, heat-affected region 108 may, in some examples, be aligned with direct bond 106. In one example, heat-affected region 108 may be visible over at least a portion of article 100 that includes direct bond 106. In other words, heat-affected region 108 may visibly overlay at least a portion of article 100 where first substrate 102 is directly bonded to second substrate 104. In another example, heat-affected region 108 may be aligned such that a centerline of heat-affected region 108 is substantially aligned with a centerline 110 of direct bond 106. In other words, heat-affected region 108 may be substantially centered around centerline 110 where first substrate 102 is directly bonded to second substrate 104. Other alignments are possible.

Although heat-affect region 108 may be visible when viewing a specific area of article 100 with a differential interference contrast microscopy, heat-affected region 108 may not be visible when viewing the same specific area of article 100 under a bright field optical microscope. FIG. 8C is an example conceptual view of the exploded section of direct bond 106 illustrated in FIG. 8B, as the bond may appear under a bright field optical microscope. In contrast to FIG. 8B, the bright field view of direct bond 106 in FIG. 8C is characterized by a substantial absence of any heat-affected region. For example, this region of direct bond 106 may exhibit a uniform brightness and contrast when viewed under a bright field optical microscope.

An article that includes a direct bond formed between two substrates in accordance with the techniques of this disclosure may exhibit different characteristics in addition to or in lieu of a heat-affected region that is visible with a differential interference contrast microscope. For example, a direct bond formed using the techniques of this disclosure may exhibit improved chemical resistance as compared to direct bonds formed using other techniques.

Any suitable analytical technique may be used to measure the chemical resistance of a direct bond formed between two substrates. As one example, the chemical resistance of a direct bond may be characterized by exposing the direct bond to a reactive chemical species and then measuring the size of any separation gap(s) that appears between the substrates as a result of chemical attack. For example, with reference to FIGS. 1A and 1B for ease of description, article 10 may be cut transversely (e.g., across the Z-X plane illustrated in FIG. 1B) to expose the direct bond between first substrate 12 and second substrate 14. The direct bond may then be exposed to a chemical species by submerging the exposed cross-section of the direct bond in a chemical etchant for approximately 15 seconds at room temperature. An example chemical etchant may include HF containing oxidizing etches and/or a buffered within an oxidizing agent (e.g., chromic acid). After removing article 10 from the chemical etchant, the cross-section of the direct bond exposed to the etchant may be inspected, e.g., with a scanning electron microscope, to determine if the chemical etchant created a separation gap between first substrate 12 and second substrate 14. The chemical etchant may create a separation gap between first substrate 12 and second substrate 14 by eroding a portion of the direct bond formed between the two substrates.

FIGS. 9A and 9B are contrasting cross-sectional schematic illustrations of direct bonds between first substrate 12 and second substrate 14 as the bonds may appear after chemical etchant testing. Specifically, FIG. 9A is a schematic illustration of an example direct bond between first substrate 12 and second substrate 14 with substantially no separation gap between the two substrates. FIG. 9B is a schematic illustration of an example direct bond between first substrate 12 and second substrate 14 with a separation gap 112 visible between the two substrates. Chemical etchant may create separation gap 112 by eroding material between first substrate 12 and second substrate 14.

In some examples, two substrates directly bonded together in accordance with the techniques of this disclosure may effectively resist chemical attack when exposed to a chemical etchant according to the process outlined above. In some examples, two substrates bonded together in accordance with the disclosure may resist chemical attack such that the substrates exhibit a separation gap (i.e., a gap measured in the Z-direction indicated on FIG. 9B) less than approximately 20 nanometers such as, e.g., less than approximately 10 nanometers after being exposed to a chemical etchant. In some additional examples, two substrates bonded together in accordance with the disclosure may resist chemical attack such that the substrates exhibit substantially no separation gap between the substrates after exposed to a chemical etchant.

An article that includes a direct bond formed between two substrates in accordance with the techniques of this disclosure may exhibit unique mechanical characteristics in addition to or in lieu the chemical characteristics outlined above. For example, a direct bond formed between first substrate 12 and second substrate 14 in accordance with the techniques of this disclosure may exhibit a tensile strength greater than a tensile strength exhibited by a direct bond formed using other techniques.

While again not being bound by any particular theory, it is that believed that the localized heating achieved with the laser-assisted bonding techniques of the disclosure may rapidly induce covalent bonds to form across substantially the entire interface between the two substrates being bonded together.

In some examples, a direct bond forming according to the disclosure may exhibit a tensile strength greater than at least approximately 80 percent of a tensile strength of either first substrate 12 or second substrate 14, such as, e.g., a tensile strength greater than at least approximately 95 percent of the tensile strength of either first substrate 12 or second substrate 14, or even a tensile strength greater than at least approximately 98 percent of the tensile strength of either first substrate 12 or second substrate 14. For example, if first substrate 12 exhibits a tensile strength of 1900 megapascals (MPa) before bonding, second substrate 14 exhibits a tensile strength of 7000 MPA before bonding, and a direct bond formed between first substrate 12 and second substrate 14 exhibits a tensile strength greater than at least approximately 95 percent of the tensile strength of either first substrate 12 or second substrate 14, then the direct bond formed between first substrate 12 and second substrate 14 exhibits a tensile strength greater than 6650 MPa (i.e., 0.95×7000).

In some examples, a direct bond formed according to the disclosure may exhibit a tensile strength greater than a tensile strength of either first substrate 12 or second substrate 14. In other words, a direct bond formed between first substrate 12 and second substrate 14 according to the disclosure may be stronger than the strongest of the two materials that are bonded together.

In some examples, a direct bond formed according to the techniques of the disclosure may exhibit a fracture toughness (i.e., Mode 1 interfacial fracture toughness) greater than approximately 0.75 MPa*SQRT(M). Other fracture toughness values are possible, however, and the disclosure is not limited in this respect.

While a direct bond formed between two substrates has generally been described with respect to article 10 in FIG. 1, the techniques of the disclosure may be useful for a variety of different applications, as will be appreciated by those of ordinary skill in the art. In one example, two semiconductor materials can be bonded together to form a semiconductor article. In another example, two circuit materials can be bonded together to form an electronic circuit component. Other applications are both possible and contemplated.

Moreover, while the present disclosure generally referred to article 10 as having "a bond" between first substrate 12 and second substrate 16, it should be appreciated that the bond between first substrate 12 and second substrate 16 may, in fact, be created by a plurality covalent bonds or electrical interactions between different atoms or molecules. Therefore, in some applications, a bond between first substrate 12 and second substrate 14 may be characterized as a region between first substrate 12 and second substrate 14 that functions to hold the two substrates in a fixed arrangement.

The following examples may provide additional details about directly bonded articles formed in accordance with this disclosure.

EXAMPLES

Different sample articles were constructed for testing in the following examples. Each article included a first substrate of silicon that was directly bonded to a second substrate of sodium borosilicate glass (BSG). Except as noted below, each article was constructed using substantially identical techniques. For example, each article was constructed by polishing a wafer of silicon and a wafer of BSG until each wafer exhibited an average surface roughness (Ra) less than approximately 5 angstroms. After polishing, each wafer of silicon and BSG was exposed to nitrogen plasma to activate the contact surfaces of the wafers. The wafers were then ultrasonically rinsed in a bath of deionized water for approximately one minute to remove particles from the contact surfaces of the wafers. After rinsing, a silicon wafer and a BSG wafer were placed in face-to-face contact to form a direct bond between the two wafers. The two wafers were then annealed according to the parameters identified below to strengthen the direct bond between the wafers.

After forming the direct bond between the silicon wafer and the BSG wafer as outlined above, a laser beam was directed through the BSG wafer and onto the silicon wafer to heat the direct bond previously formed between the two wafers. The laser beam was traversed across the entire contact area between the silicon wafer and BSG wafer to heat the entire direct bond formed between the two wafers. The laser beam was supplied by a fiber-delivered diode laser. The laser emitted radiation at a wavelength of 976 nanometers. The laser provided a minimum laser beam spot size of 200 micrometers at focus using a focusing lens of 100 millimeters. Different test articles received different amounts of laser energy as identified in the examples below.

Example 1

Using the Direct Bonding Techniques Described Above

Four test articles were constructed for bond strength testing. The different articles were each fabricated from a wafer of silicon and a wafer of BSG using the procedure described above. For each test article, the wafer of BSG was shaped into a chevron and the wafer of silicon was shaped into a reverse chevron that corresponded to the chevron shape of the BSG wafer. The two wafers were then placed in face-to-face contact to establish a direct bond between the two wafers. The two wafers were then annealed (i.e., heated) at 250 degrees Celsius for approximately one hour under a nitrogen blanket to strengthen the direct bond between the wafers.

After forming the direct bond between the silicon wafer and the BSG wafer, a laser beam was directed through the BSG wafer and onto the silicon wafer for some of the articles. The laser beam was traversed across the contact location between the silicon wafer and the BSG wafer to heat substantially the entire contact area between the two wafers. Table 1 identifies the different laser powers that were used to fabricate each article.

TABLE 1

| Article | Amount of Power Delivered by the Laser (Joules/square millimeter) |
|---------|-------------------------------------------------------------------|
| A       | No laser treatment - Direct bonding only                          |
| B       | 6                                                                 |
| C       | 2                                                                 |
| D       | 3                                                                 |

Figure 10:
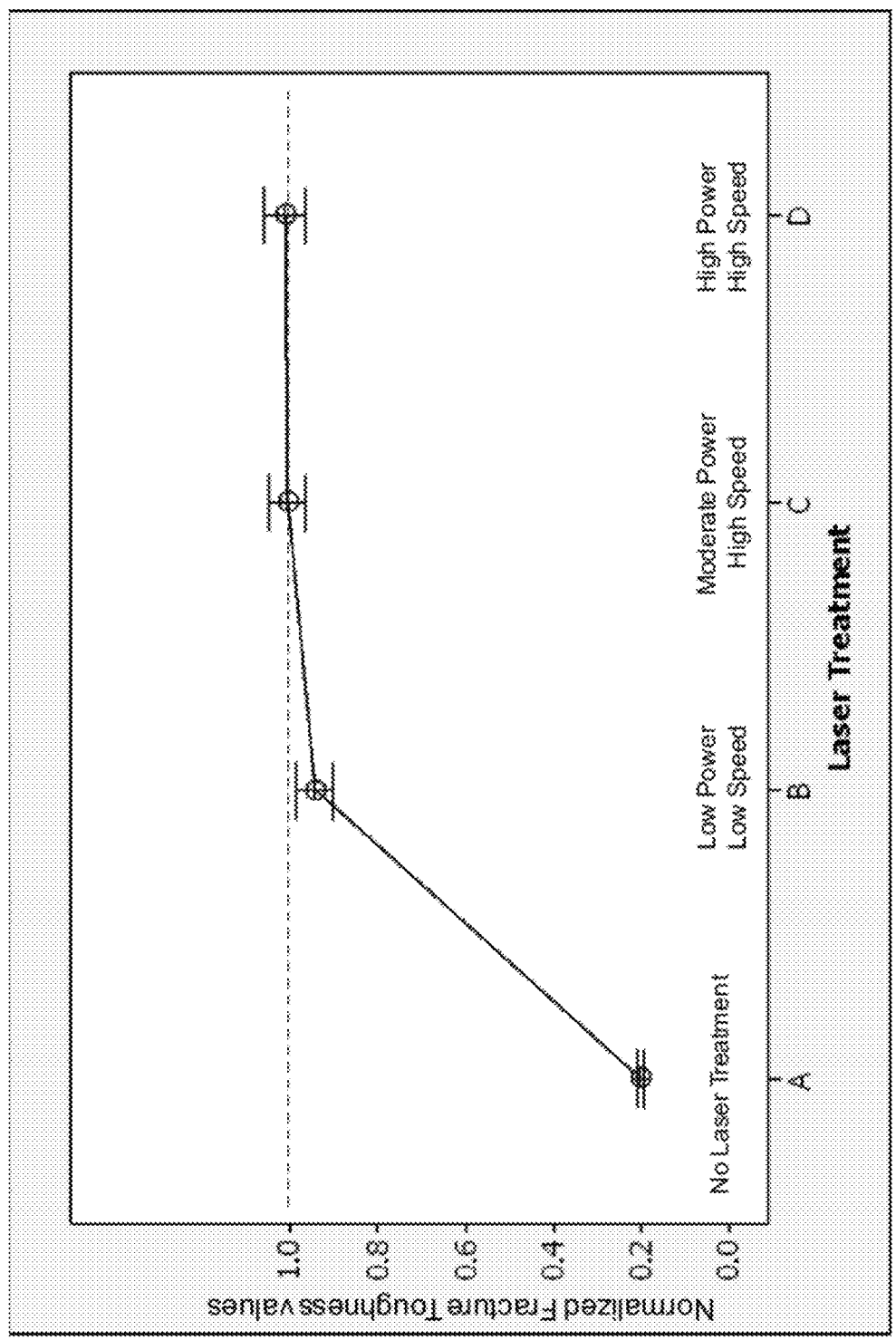
FIG. 10 is a plot of example normalized fracture toughness values for several example test articles.

After constructing the different articles according to the parameters outlined above, each test article was tested in accordance with standard SEMI MS5-1107, entitled "Test Method for Wafer Bond Strength Measurements Using Micro-Chevron Test Structures," as promulgated on Sep. 5, 2007. Fracture toughness values for each test article were measured, and the fracture toughness values were normalized relative to the fracture toughness of BSG (i.e., unbounded BSG). FIG. 10 illustrates these normalized fracture toughness values.

Example 2

Using the Direct Bonding Techniques Described Above

In this example, different bonded articles were constructed for visual characterization to evaluate the effect that laser heating has on a previously formed direct bond. Five test articles were fabricated for visual characterization. Each article was fabricated from a wafer of silicon and a wafer of BSG using the direct bonding procedures described above. For each article, the two wafers were placed in face-to-face contact to establish a direct bond between the two wafers. The two wafers were then annealed (i.e., heated) at 250 degrees Celsius for approximately one hour under a nitrogen blanket to strengthen the direct bond between the wafers. Thereafter, a laser beam was directed on a portion of the direct bond between the two wafers to heat and strengthen the direct bond. A portion of the direct bond between the two wafers did not receive laser energy. This portion served as the control region for each article. Different laser energies were used for different articles as outlined below.

After constructing the different articles according to the process described above, the articles were prepared for scanning electron microscopy (SEM) analysis. Each article was cut transversely to expose a cross-section of the article that included a portion of direct bond that received laser energy and a portion of direct bond that did not receive laser energy. The cross-sections then received a five second buffered oxide etch followed by a fifteen second etch with two parts chromic acid and one part hydrofluoric acid to prepare the cross-sections for SEM analysis. The cross-sections were then viewed under a scanning electron microscope.

Figures 11A, 11B:
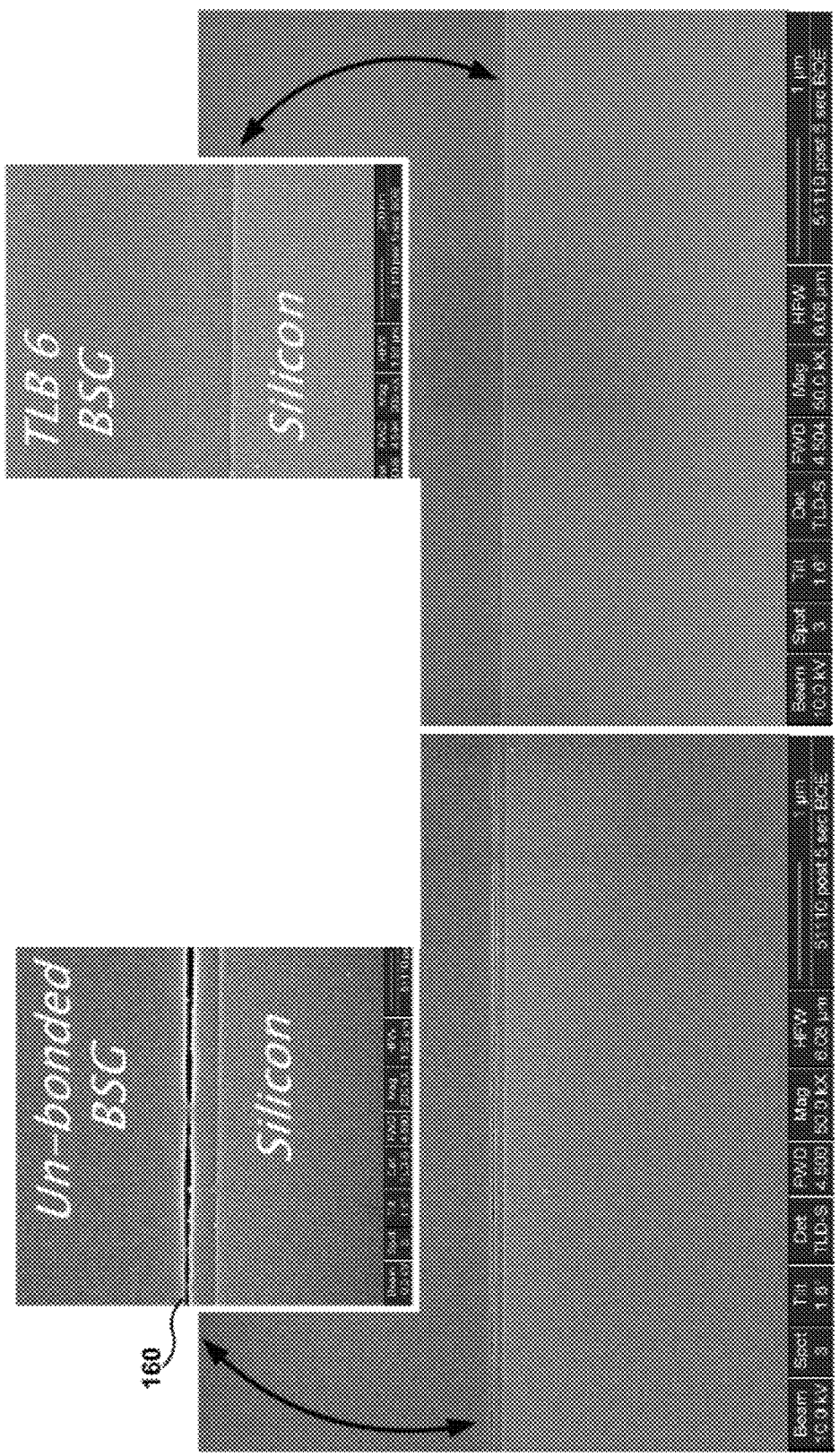
FIGS. 11A and 11B are scanning electron microscopy images for a laser-enhanced direct bond and a non-laser enhanced direct bond that were each exposed to an oxide etch containing hydrofluoric acid.

FIG. 11A is a SEM image of a cross-section of a directly bonded article that did not receive laser treatment. FIG. 11B is a SEM image of a cross-section of the same article illustrated in FIG. 11A showing a portion of the direct bond that did not receive laser treatment. In the portion shown in FIG. 11B, the direct bond was strengthened with a 1070 nanometer wavelength fiber laser with a 200 micrometer spot size delivering 14 Watts of power while traveling at 25 millimeters per second. The chemical etchant did not create a gap in the directly bonded region that received laser treatment (FIG. 11B). Conversely, the chemical etchant created a gap 160 in the directly bonded region that did not receive laser treatment (FIG. 11A). This suggests that a direct bond strengthened with laser energy, according to the techniques of the disclosure, may be more chemical resistant than a direct bond that is not strengthened with laser energy.

Example 3

Using the Direct Bonding Techniques Described Above

In this example, a bonded article was constructed for visual characterization to evaluate the effect that laser heating has on a previously formed direct bond. The article was fabricated from a wafer of silicon and a wafer of BSG using the direct bonding procedures described above. Specifically, the article was fabricated by placing two wafers in face-to-face contact to establish a direct bond between the two wafers. The two wafers were then annealed (i.e., heated) at 250 degrees Celsius for approximately one hour under a nitrogen blanket to strengthen the direct bond between the wafers. Thereafter, a laser beam was directed on the contact location between the two wafers to heat and strengthen the direct bond. The laser beam was traversed across the contact location between the two wafers twice, generally following the pattern described above with respect to FIG. 7C.

After constructing the article according to the process described above, the contact region between the silicon wafer and the BSG wafer was visually inspected with both a differential interference contrast microscope and a bright field optical microscope. For each inspection, the contact location between the silicon wafer and the BSG wafer was viewed through the BSG wafer.

Figure 12:
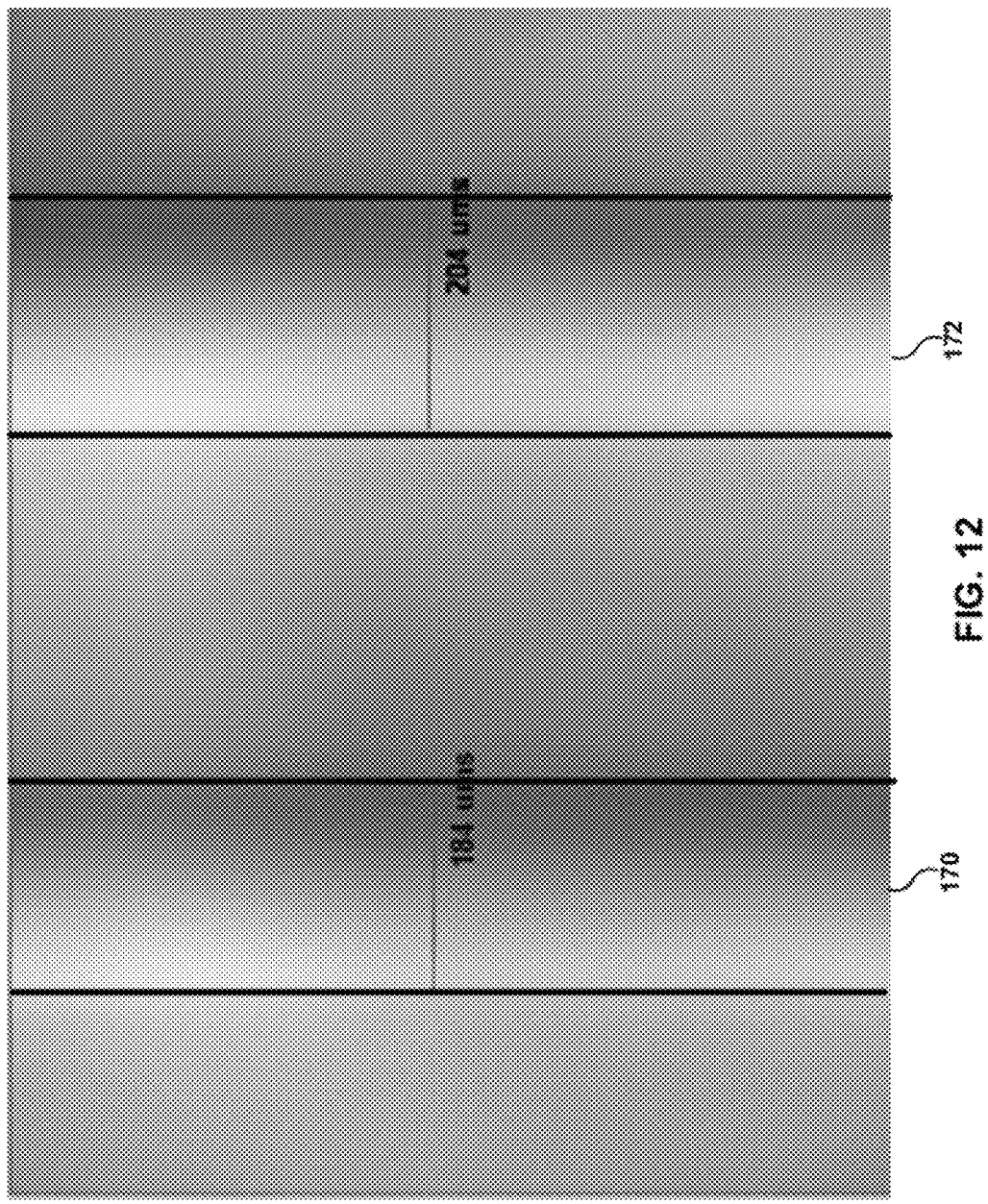
FIG. 12 is differential interference contrast microscopy image of a direct bond on a test article manufacturing using the techniques of the disclosure contact location of the article.

FIG. 12 is a differential interference contrast microscopy image of the contact location of the article. As seen in FIG. 12, two heat-affected regions 170 and 172 (bounded by dark lines in FIG. 12 for ease of illustration) were visible when viewing the contact location with a differential interference contrast microscope. The first heat-affected region 170 had a width of approximately 184 micrometers (um). The second heat-affected region 172 had a width of approximately 204 micrometers. Heat-affected regions 170 and 172 were not visible when viewing the contact location of the article under a bright field optical microscope.

Various examples have been described. These and other examples are within the scope of the following claims.

The invention claimed is:

1. A method comprising:

placing a first surface of a first substrate in contact with a second surface of a second substrate to create a direct bond between the first substrate and the second substrate at a contact location, the contact location being defined where at least a portion of the first surface of the first substrate contacts at least a portion of the second surface of the second substrate; and directing a laser on at least a portion of the contact location to further strengthen the direct bond between the first substrate and the second substrate, wherein the laser comprises a continuous wave laser that delivers between approximately 1 Joule per square millimeter ($J/mm^2$) and approximately 8 Joules per square millimeter, wherein the first and second surfaces are selectively prepared such that the direct bond is solely formed from a face-to-face contact at the contact location of the selectively prepared surfaces, wherein the face-to-face contact generates a molecular attraction having an interfacial fracture toughness that prevents separation between the first and second substrates, and wherein directing the laser on the at least the portion of the contact location comprises heating only a region of the first substrate and the second substrate that is within approximately 100 microns of the contact location to a temperature between approximately 900 degrees Celsius and approximately 1200 degrees Celsius without heating an area of the first substrate and the second substrate that is beyond approximately 100 microns from the contact location.

2. The method of claim 1, further comprising, subsequent to placing the first substrate in contact with the second substrate, heating the first substrate and the second substrate to strengthen the direct bond between the first substrate and the second substrate.

3. The method of claim 2, wherein heating the first substrate and the second substrate comprises heating the first substrate and second substrate to a temperature between approximately 50 degrees Celsius and approximately 150 degrees Celsius.

4. The method of claim 2, wherein heating the first substrate and the second substrate comprises heating the first substrate and second substrate to a temperature between approximately 150 degrees Celsius and approximately 350 degrees Celsius.

5. The method of claim 1, wherein the direct bond at the contact location is based on molecular attraction between first molecules of the first surface of the first substrate and second molecules of the second surface of the second substrate, wherein the molecular attraction between the first and second molecules comprises at least one of a plurality of hydrogen bonds between the first and second molecules and a plurality of covalent bonds between the first and second molecules.

6. The method of claim 5, wherein heat produced at the second substrate from directing the laser strengthens the direct bond by strengthening the molecular attraction between the first molecules of the first substrate and the second molecules of the second substrate.

7. The method of claim 1, further comprising, prior to placing the first surface in contact with the second surface, selectively preparing at least one of the first surface and second surface to increase the interfacial fracture toughness of the molecular attraction by polishing the at least one of the first surface or the second surface such that the at least one of the first surface or the second surface defines an average surface roughness (Ra) less than approximately 0.5 nanometers.

8. The method of claim 1, further comprising, prior to placing the first surface in contact with the second surface, selectively preparing at least one of the first surface and second surface to increase the interfacial fracture toughness of the molecular attraction by polishing the at least one of the first surface or the second surface such that the at least one of the first surface or the second surface defines an average surface roughness (Ra) less than approximately 1 nanometer.

9. The method of claim 1, further comprising, prior to placing the first surface in contact with the second surface, selectively preparing at least one of the first surface and second surface to increase the interfacial fracture toughness of the molecular attraction by polishing the at least one of the first surface or the second surface such that the at least one of the first surface or the second surface defines an average surface roughness (Ra) greater than approximately 2 nanometers.

10. The method of claim 1, further comprising, prior to placing the first surface in contact with the second surface, selectively preparing at least one of the first surface and second surface to increase the interfacial fracture toughness of the molecular attraction by cleaning the first surface of the first substrate and the second surface of the second substrate such that the first surface and the second surface are substantially free of particles greater than 0.1 micrometers.

11. The method of claim 1, further comprising, prior to placing the first surface in contact with the second surface, selectively preparing at least one of the first surface and second surface to increase the interfacial fracture toughness of the molecular attraction by activating the first surface and the second surface by exposing the first surface and the second surface to at least one of a nitrogen plasma or an oxygen plasma to chemically activate the first surface and the second surface.

12. The method of claim 1, wherein the laser comprises at least one of a fiber laser or a fiber-delivered diode laser.

13. The method of claim 1, wherein the first substrate is substantially transparent to a wavelength of the laser, and the second substrate is substantially opaque to the wavelength of the laser.

14. The method of claim 1, wherein the first substrate comprises sodium borosilicate glass and the second substrate comprises silicon.

15. The method of claim 1, wherein directing the laser on the at least the portion of the contact location comprises directing the laser in a straight laser beam path that substantially follows a centerline of the contact location.

16. A method comprising:

selectively preparing a first surface of a first substrate and a second surface of a second substrate by:

polishing a first surface of a first substrate and a second surface of a second substrate such that the first surface and the second surface each define an average surface roughness (Ra) less than approximately 1 nanometer, and cleaning the first surface and the second surface such that the first surface and the second surface are substantially free of particles greater than 0.1 micrometers, wherein the polishing and the cleaning of the first surface and the second surface reduces an amount of energy needed to strengthen, with a laser, a direct bond between the first substrate and the second substrate;

placing the first surface in contact with the second surface to create a direct bond between the first substrate and the second substrate at a contact location, the contact location defined where at least a portion of the first surface of the first substrate contacts at least a portion of the second surface of the second substrate; and directing a laser across at least a portion of a length of the contact location to strengthen the direct bond at the contact location between the first substrate and the second substrate, wherein the laser comprises a continuous wave laser that delivers a range of energy to the contact location from between approximately 1 Joule per square millimeter ($J/mm^2$) and approximately 8 Joules per square millimeter, wherein the first and second surfaces are selectively prepared such that the direct bond is solely formed from a face-to-face contact at the contact location of the selectively prepared surfaces, wherein the face-to-face contact generates a molecular attraction having an interfacial fracture toughness that prevents separation between the first and second substrates, and wherein directing the laser on the at least the portion of the contact location comprises heating only a region of the first substrate and the second substrate that is within approximately 100 microns of the contact location to a temperature between approximately 900 degrees Celsius and approximately 1200 degrees Celsius without heating an area of the first substrate and the second substrate that is beyond approximately 100 microns from the contact location.

17. The method of claim 16, wherein at least one of the first substrate or the second substrate defines a cavity, and at least one of the first surface or the second surface defines a perimeter around the cavity, and wherein placing the first surface in contact with the second surface comprises sealing the cavity.

18. The method of claim 17, further comprising placing at least one of a sensor or a battery on at least one of the first or the second substrate, wherein sealing the cavity comprises sealing the at least one of the sensor or the battery in the cavity.

19. The method of claim 16, wherein the first substrate comprises silicon, and the second substrate comprises at least one of a glass, fused silica, quartz, alumina, diamond, sapphire, SiC, GaN, or alumina.

20. The method of claim 16, further comprising, subsequent to placing the first surface in contact with the second surface and prior to traversing the laser across at least a portion of the length of the contact location, heating the first substrate and the second substrate to a temperature less than approximately 100 degrees Celsius to strengthen the direct bond between the first substrate and the second substrate.

21. The method of claim 16, further comprising, subsequent to placing the first surface in contact with the second surface and prior to traversing the laser across at least a portion of the length of the contact location, heating the first substrate and the second substrate to a temperature greater than approximately 150 degrees Celsius to strengthen the direct bond between the first substrate and the second substrate.

* * * * *